US010783311B2

(12) United States Patent
Studders

(10) Patent No.: US 10,783,311 B2
(45) Date of Patent: Sep. 22, 2020

(54) DRC PROCESSING TOOL FOR EARLY STAGE IC LAYOUT DESIGNS

(71) Applicant: Synopsys, Inc., Mountain View, CA (US)

(72) Inventor: John R. Studders, Durham, NC (US)

(73) Assignee: Synopsys, Inc., Mountain View, CA (US)

(*) Notice: Subject to any disclaimer, the term of this patent is extended or adjusted under 35 U.S.C. 154(b) by 162 days.

(21) Appl. No.: 15/795,633

(22) Filed: Oct. 27, 2017

(65) Prior Publication Data

US 2018/0121594 A1 May 3, 2018

Related U.S. Application Data

(60) Provisional application No. 62/415,404, filed on Oct. 31, 2016.

(51) Int. Cl.
*G06F 30/00* (2020.01)
*G06F 30/398* (2020.01)
*G06F 30/33* (2020.01)
*G06F 16/20* (2019.01)

(52) U.S. Cl.
CPC ............ *G06F 30/398* (2020.01); *G06F 30/33* (2020.01); *G06F 16/20* (2019.01)

(58) Field of Classification Search
CPC .. G06F 17/5081; G06F 17/5022; G06F 16/20; G06F 30/398; G06F 30/33
See application file for complete search history.

(56) References Cited

U.S. PATENT DOCUMENTS

| 3,896,482 | A | * | 7/1975 | Brechling | ......... H01L 27/11803 257/204 |
| 5,050,091 | A | * | 9/1991 | Rubin | ................. G06F 17/5068 716/122 |
| 5,610,833 | A | * | 3/1997 | Chang | ................. G06F 17/5036 257/E23.151 |
| 5,920,486 | A | * | 7/1999 | Beahm | ................ G06F 17/5068 257/E27.062 |
| 6,011,911 | A | | 1/2000 | Ho et al. | |

(Continued)

OTHER PUBLICATIONS

Jason Howie, "Setting Rule Priorities", Altium, Jun. 4, 2015.

*Primary Examiner* — Naum Levin
(74) *Attorney, Agent, or Firm* — Bever, Hoffman & Harms, LLP

(57) ABSTRACT

A DRC tool optimized for analyzing early-stage ("dirty") IC layout designs by performing one or more of (a) automatically selectively focusing DRC processing to selected regions (i.e., layers and/or cells) of a dirty IC layout design that are most likely to provide useful error information to a user, (b) automatically selectively ordering and/or limiting rule checks performed during DRC processing to provide the user with a manageable amount of error data in a predetermined reasonable amount of time, and (c) automatically providing error data in a graphical manner using a contrasting dot to indicate the location of each rule violation, whereby relevant problem areas of the dirty IC layout design are easily identified for correction by a human user, and non-relevant areas (e.g., missing block regions) can be efficiently identified and ignored, thereby facilitating efficient modification of the IC layout design.

20 Claims, 15 Drawing Sheets

(56) References Cited

U.S. PATENT DOCUMENTS

| | | | | |
|---|---|---|---|---|
| 6,091,846 A * | 7/2000 | Lin | G01N 21/9501 | 257/E21.525 |
| 6,378,110 B1 | 4/2002 | Ho | | |
| 6,594,599 B1 * | 7/2003 | Kent | G01R 31/31728 | 702/84 |
| 6,606,735 B1 | 8/2003 | Richardson et al. | | |
| 6,611,946 B1 | 8/2003 | Richardson et al. | | |
| 6,637,013 B1 * | 10/2003 | Li | G06F 17/5081 | 716/112 |
| 6,769,099 B2 * | 7/2004 | Li | G06F 17/5022 | 716/112 |
| 6,807,657 B2 * | 10/2004 | Frank | G06F 17/5081 | 703/15 |
| 6,834,375 B1 * | 12/2004 | Stine | H01L 22/20 | 257/E21.525 |
| 7,062,747 B2 * | 6/2006 | Horie | G03F 7/70433 | 716/55 |
| 7,117,430 B2 * | 10/2006 | Maguire, III | G06F 17/246 | 715/212 |
| 7,240,319 B2 * | 7/2007 | Bentley | G06F 17/50 | 700/121 |
| 7,529,760 B2 * | 5/2009 | Jennery | G06F 16/24564 | |
| 7,882,466 B2 * | 2/2011 | Ishikawa | G01R 31/31709 | 716/115 |
| 7,886,243 B1 | 2/2011 | Gumaste et al. | | |
| 7,904,844 B2 * | 3/2011 | Chang | G06F 17/5081 | 716/100 |
| 8,032,855 B1 * | 10/2011 | Ling | G06F 17/5072 | 716/119 |
| 8,086,981 B2 * | 12/2011 | Lai | G06F 17/5081 | 716/106 |
| 8,255,198 B2 * | 8/2012 | Krishnaswamy | G01R 31/3183 | 702/119 |
| 8,261,217 B2 | 9/2012 | Kobayashi | | |
| 8,352,887 B2 | 1/2013 | Dai et al. | | |
| 8,413,082 B2 * | 4/2013 | Castellan | G06F 17/5081 | 378/35 |
| 8,437,534 B2 * | 5/2013 | Shibuya | G01N 21/9501 | 382/149 |
| 8,448,097 B2 | 5/2013 | Dai et al. | | |
| 8,516,399 B2 * | 8/2013 | Paris | G06Q 10/10 | 716/136 |
| 8,549,451 B2 * | 10/2013 | Koizumi | G06F 17/5081 | 716/110 |
| 8,612,919 B2 * | 12/2013 | Pikus | G06F 17/5081 | 716/102 |
| 8,627,240 B1 * | 1/2014 | Acar | G06F 17/5081 | 385/14 |
| 8,635,582 B2 * | 1/2014 | Stellari | G06F 17/5022 | 345/619 |
| 8,677,297 B2 | 3/2014 | Chase et al. | | |
| 8,745,565 B2 * | 6/2014 | Gao | G06F 17/5072 | 716/111 |
| 8,762,912 B2 * | 6/2014 | Sun | G06F 17/5081 | 716/106 |
| 8,775,979 B2 | 7/2014 | Oberai | | |
| 8,775,999 B2 * | 7/2014 | Chueh | G06F 17/5072 | 716/118 |
| 8,949,203 B1 * | 2/2015 | O'Riordan | G06F 17/5081 | 707/694 |
| 9,141,743 B1 * | 9/2015 | McCracken | G06F 17/5068 | |
| 9,292,652 B2 * | 3/2016 | Aggarwal | G06F 17/5081 | |
| 9,594,867 B2 | 3/2017 | Yu et al. | | |
| 9,659,137 B2 * | 5/2017 | Lee | G06F 17/5081 | |
| 9,934,349 B2 * | 4/2018 | Bhawnani | G06F 17/5081 | |
| 10,078,723 B1 * | 9/2018 | Ghosh | G06F 17/5081 | |
| 10,387,608 B2 * | 8/2019 | Adel | G03F 7/70633 | |
| 2005/0138591 A1 * | 6/2005 | Shirai | G06F 17/5081 | 716/111 |
| 2005/0210429 A1 | 9/2005 | Keller et al. | | |
| 2006/0036977 A1 * | 2/2006 | Cohn | G06F 17/5072 | 716/51 |
| 2010/0306720 A1 * | 12/2010 | Pikus | G06F 17/5081 | 716/106 |
| 2016/0275153 A1 * | 9/2016 | Wu | G06T 1/00 | |

* cited by examiner

| RUNSET ORDER | RUNSET RULE TYPES |
|---|---|
| (FIRST) | Simple/low cost |

Simple/low cost
    Single layer grid-based checks
      o  All vertices on a layer must be on a XX micron grid
    Single layer non-measurement checks
      o  All shapes on this layer must be a rectangle
      o  All shapes on this layer must be a square
    Single layer 'basic' measurement checks
      o  All shapes must be a rectangle of size X by Y
      o  All shapes must be a square of size Z by Z
    2 layer non-measurement overlap/anti-overlap checks
      o  Via coverage checks. All via layer (ViaX) must be covered by metal above and below.
            Can be accomplished with a Boolean "AND" operation
      o  Exclusion checks. Metal must not be overlapped by dummy metal for the same layer (ie M2 and M2_Dummy cannot overlap)
            Boolean AND/NOT can accomplish this depending on logic desired by runset author Medium cost
    Single layer width/spacing checks with no extension/projection options enabled
      o  Single layer spacing checks on all the drawn (IE layers that are in the design database) and simplified by the tool to not check extensions (IE don't do corner projection/extension)
      o  Single layer width checks on drawn layers no projection Med/high cost
    2 layer checks on drawn (assign) layers-basic enclosure checks, basic spacing checks
    Simplified connect/text sequence to look for text shorts
    Device formation checks (look for legal/illegal device constructs)

High cost
    Width/space on 'highly derived' layers. IE layers that are a long way from the drawn layers when you look at the runset as a dependency graph Very high cost
    Density rules
    Muli-pattern compliance checks (double, triple, higher-order MPT checks)
    Connect-based spacing checks (IE voltage-dependent spacing)

(LAST)

FIG. 6

DRC PROCESSING TOOL FOR EARLY STAGE IC LAYOUT DESIGNS

RELATED APPLICATIONS

This application claims priority from U.S. Provisional patent application 62/415,404, entitled "DRC PROCESSING TOOL FOR EARLY STAGE IC LAYOUT DESIGNS", which was filed on Oct. 31, 2016, and is incorporated by reference herein.

BACKGROUND OF THE DISCLOSURE

This disclosure generally relates to design rule checking (DRC) software tools and the methods performed by such tools, and more particularly to DRC tools and methods that are optimized to facilitate efficient DRC processing on early-stage "dirty" IC layout designs.

RELATED ART

The development and physical production of an integrated circuit (IC) device is a long, complicated process that typically involves a wide range of design tools and fabrication systems. In designing an integrated circuit (IC) device, engineers typically rely upon computer simulation tools to help create a circuit schematic design consisting of individual devices coupled together to perform a certain function. To actually fabricate this circuit in a semiconductor substrate, the circuit is translated into a series of layout patterns using special computer aided design (CAD) tools, where each layout pattern (layer) is a two-dimensional pattern of shapes generally corresponding to physical features disposed in one vertical layer of the physical circuit. Mask generation tools then covert the layout patterns into a series of corresponding masks (aka, reticles; clear substrates on which the layout patterns is replicated in the form of light-blocking material). The masks are the utilized in a semiconductor fabrication system (fab) that is controlled by a selected photolithographic manufacturing process (flow) to form corresponding structures on and over a semiconductor wafer such that multiple copies of the IC device are fabricated on the wafer. The processed wafer is then diced into IC die (chips), each including one IC device, and then the chips are packaged to form finished IC devices.

FIG. 1 shows a system environment for performing Design Rule Checking (DRC) processing, which generally includes a design layout database 52, a user interface 54, a DRC tool 56, a DRC rule deck 58, and the DRC results 59. The DRC tool 56 reads in an IC layout design from the design layout database 52 and DRC rules associated with a selected fabrication process from the DRC rule deck 58, checks the IC layout design for all violations of the DRC rules, and produces the DRC results 59 that are then displayed on the user interface 54.

DRC is traditionally one of the final steps performed during the active design phase of IC device production (i.e., before tape-out and mask generation). The purpose of signoff-phase DRC is to ensure that the IC can be manufactured by the factory (fab) that has been chosen to build it. The step of committing to manufacturing can very expensive to an IC device designer/seller that pays a fab to produce an IC device based on the designer/seller's IC design; it can cost tens of millions of dollars to commit to build an IC device, and this money is typically lost by the designer/seller when a fabricated device fails to function as intended due to errors in the design layout. DRC processing helps ensure that the IC design can be built by the target fab before IC tooling costs are incurred. The assurance provided by DRC processing is worth more than just the cost of IC tooling—layout errors discovered during manufacturing can lead to manufacturing delays, which in turn can cause the IC designer/seller to miss important market windows. It is therefore very important that each final IC layout design achieves DRC "signoff" (i.e., verification that all cells of all layers of the final IC layout design meet all established design rules set by the target fab) in order to avoid losing money and time to market.

More recently, DRC processing is increasingly being implemented multiple times during an IC's active design phase in order to achieve a final IC layout design in the shortest possible time. Early-stage IC layout designs typically include missing and/or incomplete components or sub-blocks, and are therefore often referred to as "dirty" layout designs. The missing/incomplete layout design portions of dirty IC designs occur because complex IC typically comprise multiple interconnected circuit blocks that are generated by different sources (e.g., different blocks may be developed by different design teams in the designer/seller company, and some blocks may be purchased from external licensed sources). Running DRC early and often during the active design phase facilitates identifying design rule violations generated by components, sub-blocks or blocks (collectively referred to below as "blocks" for brevity) that are added to the developing IC design, thereby allowing the designer/seller to implement the necessary layout corrections on these established circuits while awaiting the completion of missing polygons. This early DRC processing also provides assurance that the evolving IC design is converging on DRC signoff (i.e., helps to identify fundamental layout errors that require significant rearrangement of the component blocks) in order to avoid surprises at the anticipated end of the design process. The DRC run done at the end of the design process—which is typically called the final signoff—is usually straightforward because the design has been through DRC runs many times, and is free of major manufacturing violations.

A problem with implementing conventional DRC tools early in the IC design process is that "signoff" DRC tools (e.g., IC Validator produced by the assignee of the present application) have been developed to check every block very precisely, to search for and report every error in the early stage design. If designs are "dirty" then the signoff DRC tool can run for a very long time and produce gigabytes of data due to unavoidable violations caused by the missing blocks and incomplete connections. That is, performing DRC processing on early-stage "dirty" IC layout designs typically generate an overwhelming number of rule violations, and significantly lengthens the time required for DRC processing to reach completion. The number of design rules checked during DRC processing for advanced semiconductor manufacturing processes can exceed 10,000, and the number of polygons or other shapes in an advanced IC layout design can exceed 100 billion, whereby it is easy to understand that the total processing runtime needed to perform conventional DRC processing on the layout design of an advanced IC device is typically significant (i.e., multiple days). Moreover, a dirty IC layout design for can yield hundreds of millions of rule violations, and the runtime of a DRC tool is increased by each rule violation, meaning that DRC runtimes can be very long when applied to the dirty IC layout design of an advanced IC device. This long runtime also requires valuable computer resources that could otherwise be used to advance the IC design, thereby delaying time to market. Moreover, an error report generated by conventional DRC tools for dirty advance IC layout designs can include hundreds of millions of DRC rule violations, which can be overwhelming to the human(s) trying to read and interpret the error report and correct (fix) the layout design features causing the numerous rule violations.

Conventional DRC tools provide user-controlled mechanisms that may be selectively utilized to limit DRC runtime and/or error report when DRC processing is applied to dirty IC layout designs. Some conventional DRC tools allow a user to limit DRC processing to a subset of DRC rules that are manually selected by the user from the DRC rule deck, or to a manually selected subset of the total layers making up the dirty IC layout design. Some conventional DRC tools also allow a user to select certain regions or features in each dirty IC layout layer that are ignored during DRC processing. However, these conventional DRC tool approaches require that users know in advance which rules, layers or regions/features should be ignored during subsequent DRC processing of their dirty IC layout design, which is impractical in many cases.

What is needed is an early-stage DRC tool capable of analyzing early-stage (dirty) IC layout designs and providing useful error information in a substantially shorter amount of time than conventional signoff DRC tools. What is particularly needed is such an early-stage DRC tool that operates without requiring users to manually identify layers or regions/features of their dirty IC layout design, and without requiring the users to manually identify rules of the DRC rule deck to omit during DRC processing. What is also needed is an early-stage DRC tool that automatically presents a manageable amount of error information for a dirty IC layout design in a predetermined reasonable amount of time, and presents the error information in a manner that is easily comprehended by human users in order to minimize production cycles.

SUMMARY

The present invention is directed to improved design rule checking (DRC) tools and associated methodologies that enhance DRC processing of early-stage (dirty) IC layout designs by way of utilizing one or more novel processing techniques (features) including automatically recognizing and eliminating/marking problematic cell placements and automatically arranging the order of rule check operations prior to DRC processing, limiting DRC processing to a predetermined time limit or predetermined number of errors, and generating error reports in both textual and intuitive graphics-based formats. Automatically recognizing problematic cells involves identifying cells that have suspect placement (e.g., overlapping cells) during pre-DRC hierarchy processing. The problematic cells are then either eliminated from the design layout workspace or marked for DRC processing only after DRC processing of all non-problematic cells is completed within preset time/error budget constraints, thereby focusing DRC processing on selected regions (i.e., cells) of a dirty IC layout design that are most likely to provide useful error information (i.e., maximizing the number of rules checks performed) within a minimal DRC processing runtime. Automatically ordering the number of rule checks performed during DRC processing involves sequentially performing rule checks based on predetermined criteria in order to provide maximum useful DRC error results in a minimum amount of time. For example, automatic ordering may involve arranging the rule checks based on anticipated rule execution time, where rules that execute relatively quickly are ranked higher than those that require longer execution times), whereby a maximum number of error checks are performed within a predetermined time period. Limiting the DRC processing session to a predetermined amount of time or number of detected errors facilitates providing a user with a manageable amount of error data within a predictable amount of time, which in turn facilitates faster DRC signoff. Finally, automatically providing error data in both textual and graphical forms (e.g., using a contrasting dots "heat map" to depict the X-Y locations of rule violations) provides the intuitive presentation of relevant problem areas of a dirty IC layout design that are easily identified for correction by a human user, and non-relevant areas (e.g., missing block regions) can be efficiently identified and ignored, thereby facilitating the generation of a modified layout design that can be used to fabricate a desired IC device. Implementing one or more of these novel processing techniques in the improved DRC tools of the present invention facilitates efficient correction of layout errors appearing in each early-stage "dirty" IC layout design iteration as the IC layout design progresses toward signoff by way of eliminating previously verified "known-good" cells and/or unchanged layers from incremental DRC processing, thereby significantly reducing overall DRC processing time and, as a result, overall manufacturing costs of IC devices that are subsequently fabricated using masks (reticles) produced in accordance with the finished IC layout design.

According to an embodiment of the invention, an improved DRC tool efficiently produces useful DRC error results by way of automatically setting the rule runset order utilized during DRC rule check processing (rule checking operations) in a way that optimizes or maximizes the number of rule checks that are performed in a fixed amount of time, and terminates the DRC process after either a predetermined time limit is reached or a predetermined number of rule violations are detected. In one embodiment, automatically setting the order of DRC rule execution involves assigning a rank value to each rule provided in a DRC rule deck based on an anticipated rule execution time duration of each rule (e.g., based on a number of procedures performed by each rule), then performs DRC processing by sequentially rule checking each cell in the design layout workspace based on the established rule runset order (e.g., with rule check processing performed using rules having the shortest execution time durations before rule check processing is performed using rules having longer execution time duration). In addition to automatically selecting the DRC rule execution order, the duration of the rule check process is limited by either (a) a predetermined maximum processing time period, or (b) a predetermined maximum number of rule violations. A benefit of limiting rule check time is that this approach optimizes the generation of useful error data in a predictable reasonable amount of time (e.g., three hours) by way of first performing the largest possible number of short-duration ("inexpensive") or more-relevant rule checks, and performing "expensive" or less relevant rule checks later in the DRC processing only if the predetermined time limit has not been reached. A benefit of limiting rule checking to a limited number of rule violations is that this approach avoids the generation of overwhelming amounts of error data, thereby allowing a user/operator to more efficiently apply corrections that facilitate signoff in a shorter amount of time. By combining rule runset ordering and time/error limiting, the present invention provides a DRC tool that greatly enhances efficient analysis and correction of early-stage IC layout designs.

According to another embodiment of the invention, the improved DRC tool automatically detects systematic or fundamental layout errors by way of recognizing when a particular DRC rule generates an unusually high rate of rule violations during first-pass rule check processing, and suspends (i.e., postpones or omits) further rule checks using the high-violation-rate-causing rule (i.e., bypasses subsequent cells in the design layout workspace), at least until first-pass DRC processing is completed for all other rules in the rule deck. Systematic or fundamental layout errors typically extend across multiple adjacent cells, resulting in a high rate of violations (rule check errors) to occur when the cells are checked using particular rules that are violated by the systematic/fundamental error. In this embodiment, the DRC tool automatically detects such systematic/fundamental errors by way of detecting unusually high rule violation (error) rate values during a rule check operation involving a particular DRC rule, and suspends further rule checking using the particular high-violation-rate-causing DRC rule in order to provide additional time DRC processing budget for checking other rules. That is, in this case the DRC tool terminates further rule check operations using each DRC rule that generates an unusually high error rate, but continues rule check operations using other non-checked rules (e.g., the next rule in the runset order). In one embodiment, the DRC tool identifies a particular layout region (e.g., a block of adjacent or otherwise related cells) that may be associated with a detected systematic/fundamental error due to combined high error rates, reclassifies/designates all cells in the identified region as problematic cells, and then, based on this reclassification, omits these problematic cells from all subsequent first-pass rule check operations. Accordingly, suspending rule check operations for each high-violation-rate rule and/or in each problematic region facilitates generating a larger amount of useful error data within a fixed amount of time by providing more time for rule check processing using DRC rules applied to regions that are not affected by the systematic/fundamental layout error. In one embodiment, a modified error report is generated that identifies all detected systematic/fundamental errors by way of identifying each suspended/terminated DRC rule and/or each layout region in which one or more DRC rules were suspended or terminated, thereby facilitating the entry of corresponding corrections of the associated systematic/fundamental errors at the earliest possible time during IC development, which frees valuable computer resources by preventing unnecessary or wasteful DRC processing time delays.

According to another embodiment of the invention, the DRC tool identifies one or more problematic cells in the design layout workspace during a hierarchy processing portion of the DRC process (i.e., before starting the rule checking process). In one embodiment, each problematic cell is identified by way of detecting cell sizes and/or cell location parameters that violate one or more cell placement rules (e.g., two overlapping cells that occupy the same X-Y coordinate are designated as problematic cells). All problematic cells identified during this identification process are removed/suspended from (i.e., ignored during) first-pass rule check processing, which is performed on at least some of the non-problematic cells remaining in the design layout workspace. The suspension of problematic cells from first-pass rule check processing maximizes the generation of useful DRC error data in a minimal amount of processing time by intentionally failing to perform first-pass rule checking on these "known-bad" problematic cells, whereby any time budget saved by ignoring the problematic cells is used to perform a larger number of rule checks on the remaining cells during first-pass rule checking operations, thereby facilitating the generation of more complete error data within the fixed time period. In one embodiment, if first-pass rule check processing is completed (i.e., all unmarked cells in the design layout workspace are checked using all rules in the DRC rule deck) without exceeding a maximum DRC time or error processing threshold (limit), then the problematic cells are un-suspended (added back into the design layout workspace), and second-pass rule check processing is performed on at least some of the problematic cells (i.e., at least until a maximum DRC time or error processing limit is reached). When DRC processing is completed, the error report includes a new type of DRC error data that identifies the erroneous placement of the problematic cells, thereby allowing a user/operator to apply an appropriate corrective action to eliminate the associated placement rule violation.

In accordance with another embodiment of the present invention, the DRC tool generates a design layout workspace and performs rule check operations using at least some of the improved techniques described above, and is further modified to generate DRC error reports (i.e., upon termination of the rule check processes) in which rule violations are presented using graphic error data, where each designated cell that violates one or more rule is depicted by a corresponding dot that is relatively positioned at an X-Y location corresponding to the relative X-Y location of its corresponding designated cell in the associated IC layout design layer. Particularly when combined with textual error information, DRC error reports including the graphic error information facilitates rapid comprehension of problematic IC layout layers and regions, which allows a human user to more easily interpret the DRC error results and fix the DRC errors, thereby facilitating the production of the desired IC product using a minimum amount of layout development time.

According to another embodiment of the present invention, the DRC tool is utilized in accordance with an incremental IC layout design re-verification method that facilitates efficient incremental re-verification of an IC layout design as the IC layout design progresses from its earliest stages to signoff. That is, the present invention facilitates minimal DRC run-time as new blocks are incrementally added to the IC layout design during development.

In accordance with another embodiment of the present invention, various methods are utilized to generate balanced and/or useful error data during each DRC processing session, even when the session is terminated prior to completion of all scheduled rule check processing (e.g., due to the occurrence of a large number of rule violations that exceeds the preset error limit). In one specific embodiment, each cell that violates at least one rule during the rule checking process is designated as problematic and at least temporarily removed from the design layout workspace (i.e., ignored during subsequent rule checking), whereby a balanced error report is generated in which each cell that violates at least one DRC rule is identified. In another optional embodiment, a layer-specific runset is modified to include new rules relating to the problematic cells mentioned above, where the new rules are used, for example, to pre-emptively designate unmarked cells located adjacent to the problematic cells as problematic when a large number of errors are detected in similarly positioned unmarked cells, thereby facilitating the generation of potentially more valuable error data by allowing the DRC process to focus on other unmarked cells. In yet another optional embodiment, other criteria are used to generate the rule runset order, such as the presence of known time-consuming ('expensive') operations, or based on predetermined relevance to a given layer of the IC design. According to alternative embodiments, the present invention is implemented as a method, non-transitory, computer-readable medium, and system that provide the various features and benefits set forth above. In accordance with another embodiment of the present invention, when implementing each of the processing techniques set forth above, the improved DRC tool and associated method/medium/system greatly reduces DRC tool runtime by ten and twenty times (10-20×), reduces computer resource needs (disk, memory, number of CPUs), and produces easier to comprehend error reporting (text and graphical) that allows a human user to more easily interpret the DRC error results and fix the DRC errors, thereby facilitating the production of the desired IC product.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 6 is a table including rules and associated rule runset cost values according to an exemplary embodiment of the present invention;

DETAILED DESCRIPTION

The present invention is directed to an improved DRC tool that is optimized for efficient DRC processing of early-stage (dirty) IC layout designs. The following description is presented to enable one of ordinary skill in the art to make and use the invention as provided in the context of a particular application and its requirements. In one embodiment the improved DRC tool is generated by way of modifying a conventional signoff-type DRC tool to include one or more of the novel processing techniques to dramatically speed up early-stage DRC processing, such as: automatically terminating the processing of DRC rules that generate large numbers of errors and consume large amounts of machine resources; automatically excluding bad cell placements so they are not checked; automatically determining and running basic DRC rules first and, based on intermediate results, deciding to complete the rest of the DRC rules on all layers, complete the remaining rules on a subset of layers, or complete a subset of rules on all or a subset of layers; and/or generating error reports with a manageable amount of error information so as to avoid overwhelming a user who is trying to interpret the DRC results in order to fix the design. The advantages are improved DRC tool runtime (i.e., ten to twenty times faster), reduced computer resources (e.g., disk, memory, and number of CPUs) needed to perform DRC processing, easier to comprehend error reporting (text and graphical) for a human to interpret the DRC results and fix the DRC errors.

Figure 1:
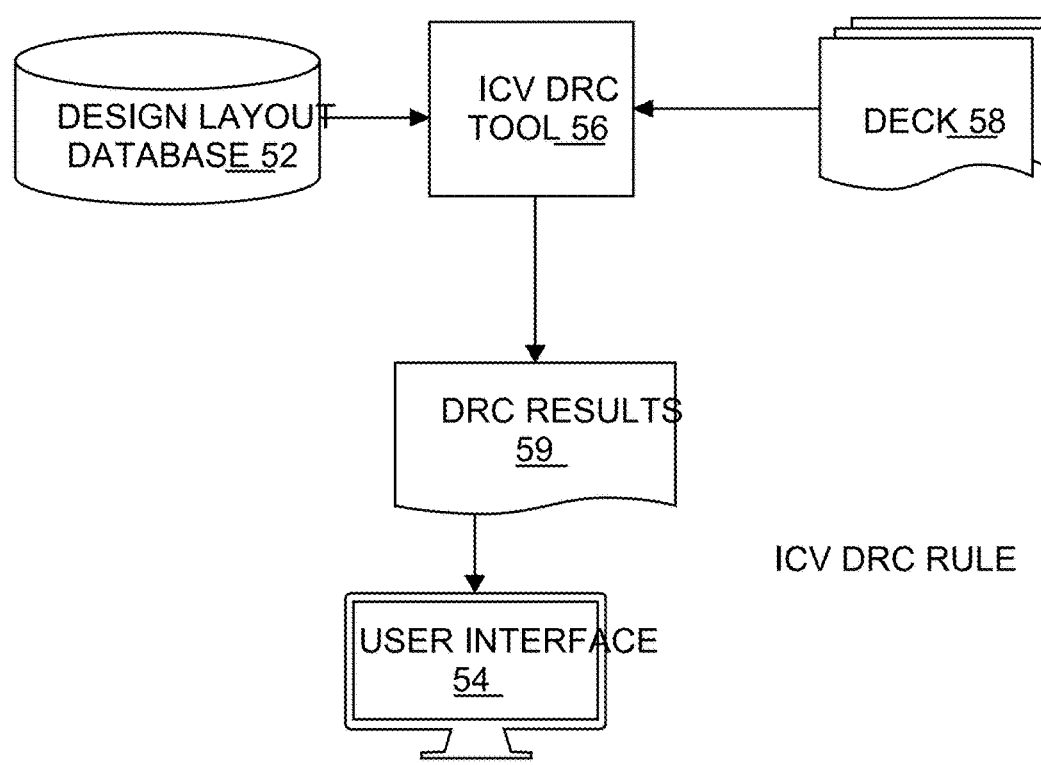
FIG. 1 illustrates a simplified conventional DRC system environment.
Figure 2:
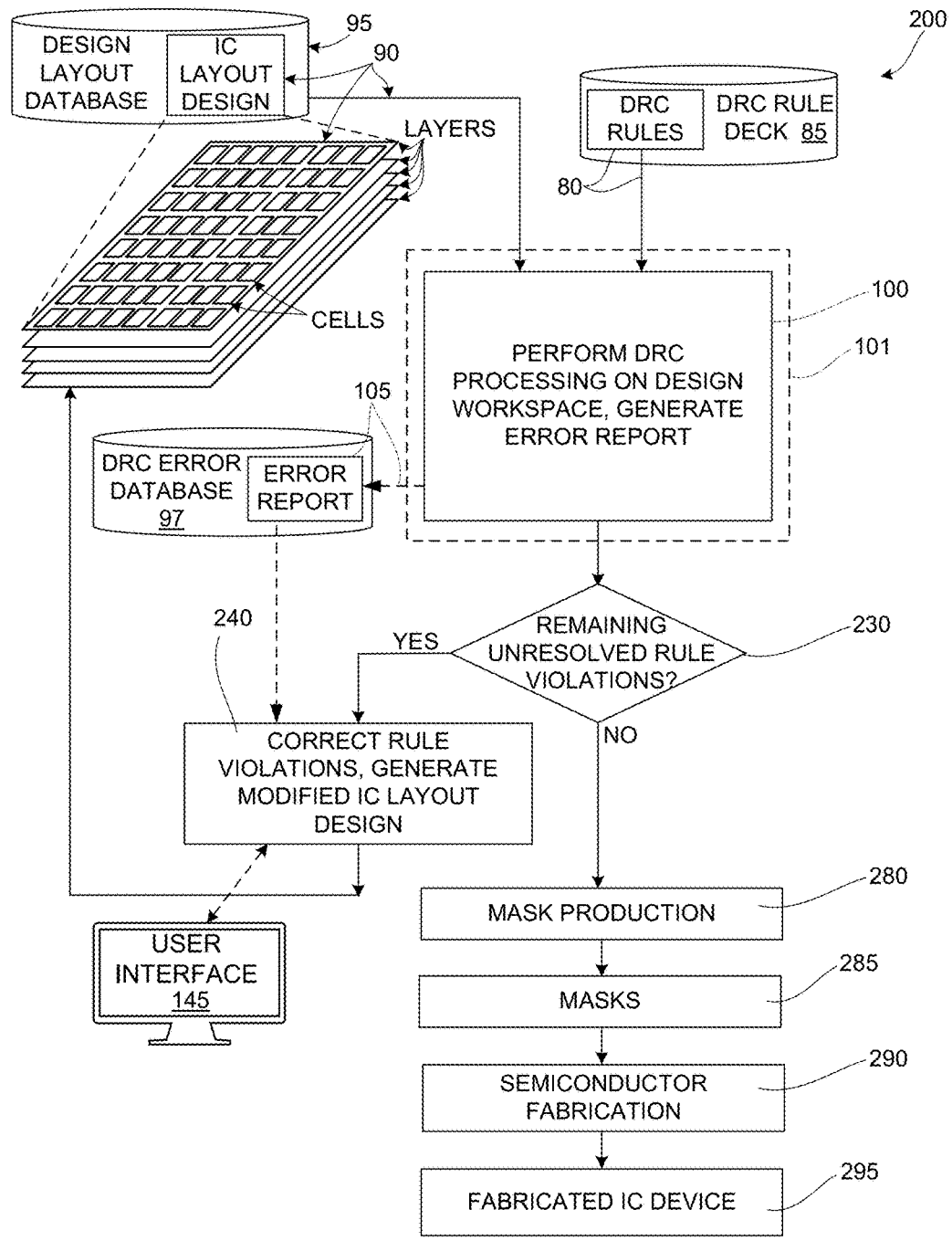
FIG. 2 is a flow diagram illustrating an integrated circuit fabrication process utilizing the improved DRC tool/method/system of the present invention.

FIG. 2 is a simplified flow diagram indicating a greatly simplified IC design and fabrication process 200 utilizing an improved DRC tool 100 according to the present invention. Referring to the top of FIG. 2, DRC tool 100 is executed on a suitable computing system 101 (shown in simplified block form for sake of brevity), and receives as input foundry-provided fundamental design rules 80 from a DRC rule deck 85 and a user's IC layout pattern 90 (i.e., the layout pattern to be analyzed), which is typically stored in a design layout database 95, where DRC rule deck 85 and design layout database 95 are stored in computer memory using known techniques. In one embodiment, IC layout pattern 90 is an early-stage (i.e., incomplete or "dirty") layout pattern, and DRC tool 100 functions as described below to efficiently identify layout errors present in the partially completed layout design. That is, according to an advantage of the present invention, DRC tool 100 functions to efficiently identify and store layout errors (rule violations) in early-stage IC layout design 90 using at least some of the DRC rules provided in DRC rule deck 85, and to provide a manageable amount of error information in the form of an error report 105 that is configured to allow an user (i.e., layout design specialist) to quickly identify and correct layout errors in the early-phase IC layout design. At the end of each DRC processing session (i.e., at the output of block 100), if the DRC results indicate remaining errors (YES in block 230), the user is provided with error report 105, which in one embodiment is stored in a DRC error database 97 in a manner suitable for display on a user interface 145, whereby the user is provided an opportunity to enter corrections that address the DRC rule violations (block 240) and/or to add additional features to the existing early-stage IC layout design. The revised/enhanced early-stage IC layout design may then be resubmitted for reprocessing by DRC tool 100. Another advantage of the present invention is that DRC tool 100 retains information process is typically repeated many times until a modified/finalized IC layout design is submitted and no errors are reported by DRC tool 100 (NO in block 230), whereby the modified IC layout design is then utilized in block 280 to produce physical masks 185, and then masks 285 are utilized in a semiconductor fabrication process (block 290) to fabricate an integrated circuit 295 including structures defined by the modified layout pattern. That is, although the primary advantage of DRC tool 100 is applicable to performing DRC processing on early-stage layout patterns, DRC tool 100 is also capable of performing sign-off DRC processing using the methodology described below.

Figure 3:
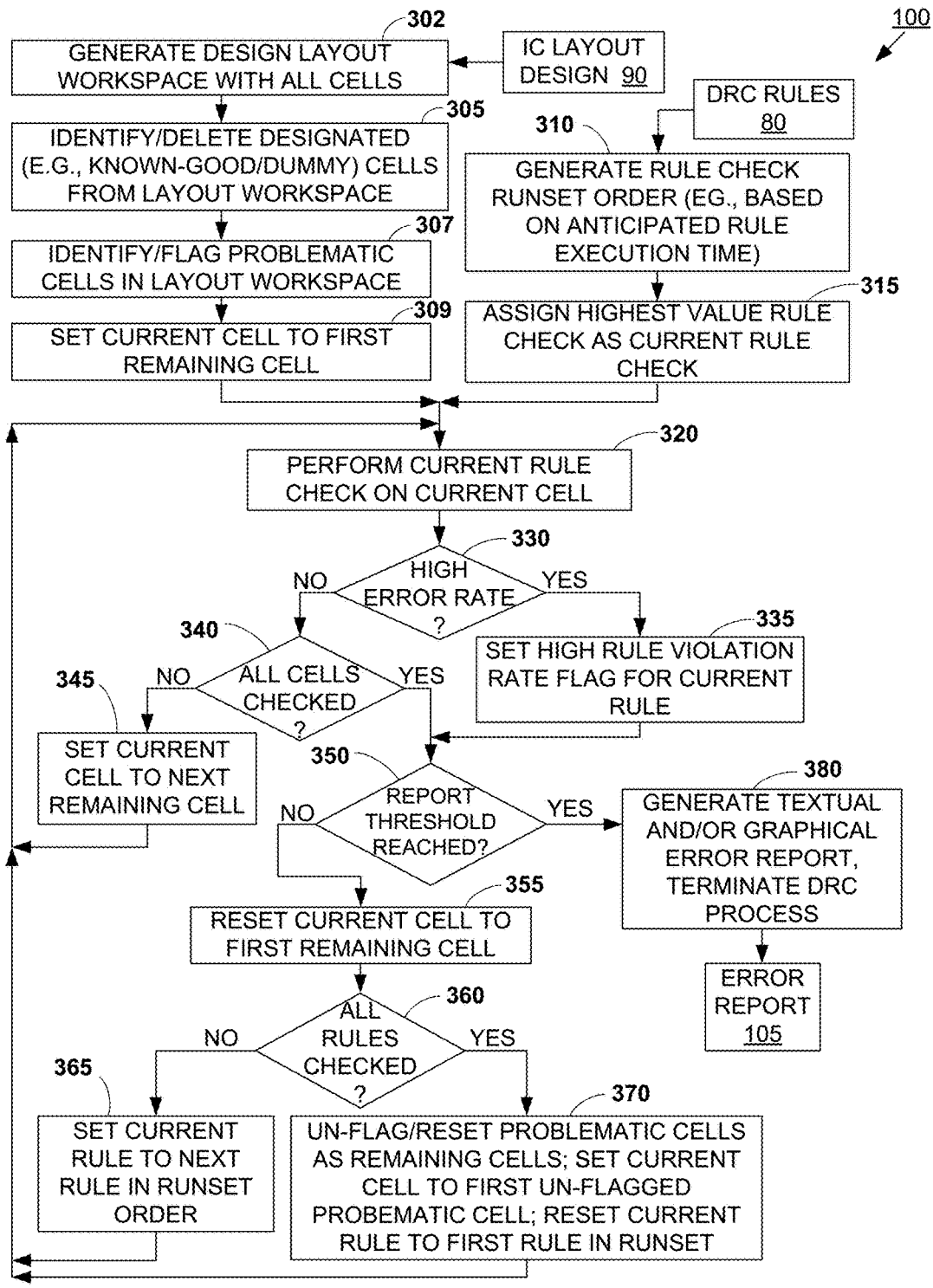
FIG. 3 is a flow diagram illustrating the improved DRC tool/method/system of the present invention according to an exemplary embodiment of the present invention.

FIG. 3 is a flow diagram depicting the DRC processing method implemented by DRC tool 100 of FIG. 2 according to an exemplary embodiment of the present invention. The process portions performed in accordance with specific blocks forming the flow diagram of FIG. 3 are described in accordance with an exemplary simplified diagram that is presented below with reference to FIGS. 4(A) to 7(L). As set forth below, the flow diagram shown in FIG. 3 incorporates multiple novel processing techniques of the present invention, each novel processing being generated by a corresponding block or group of associated blocks forming the flow diagram of FIG. 3. Accordingly, the spirit and scope of the present invention may be achieved by implementing portions of the flow diagram shown in FIG. 3, and it is understood that each appended claims is limited only by that claim's associated recited portion of the novel DRC processing method.

Referring to the top of FIG. 3, the DRC tool 100 prepares for DRC processing by writing an early-stage IC layout design 90 (e.g., from design layout database 95) into a design layout workspace (block 305) and by receiving DRC rules 80, e.g., from a rule deck (block 310). In one embodiment the processes described below with reference to blocks 302, 305, 307 are performed before the process described below with reference to block 310, but the order of execution may be reversed or the processes performed simultaneously.

Figure 4A:
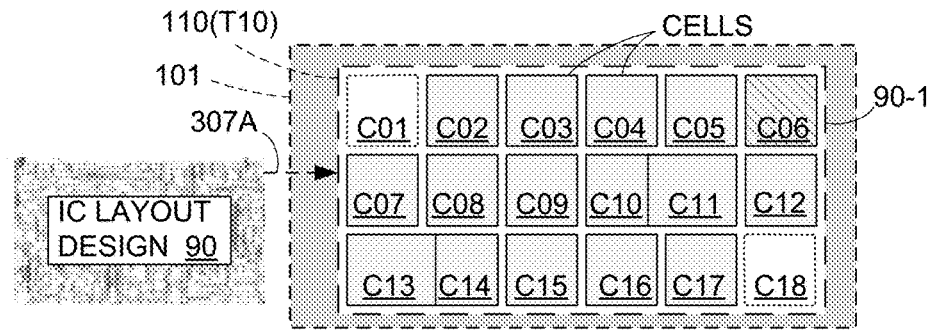
FIGS. 4(A), 4(B), 4(C) and 4(D) are simplified diagrams depicting pre-rule-check processing of an IC design layer utilized in the processing method of FIG. 3 according to an exemplary simplified embodiment.
Figure 4B:
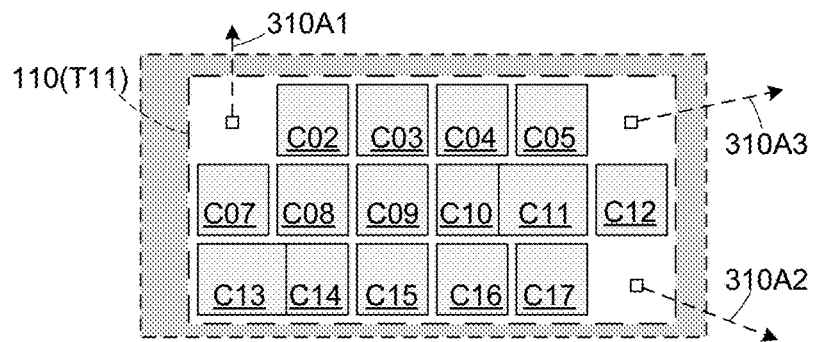
Figure 4C:
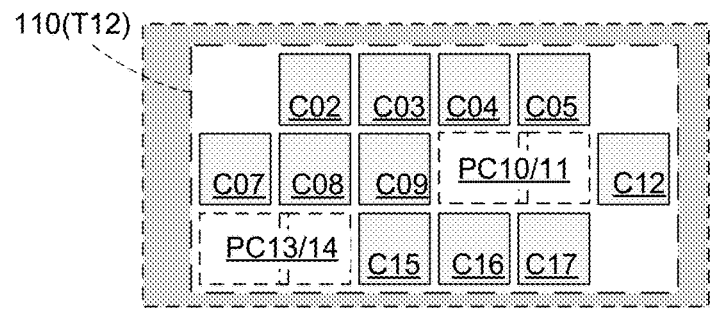

Referring to the upper left portion of FIG. 3, the processes associated with blocks 302 to 307 involve the generation and subsequent modification of a design layout workspace including cells that collectively define at least a portion of early-stage IC layout design 90. Referring briefly to FIG. 2, IC layout design 90 typically includes multiple layers, where each layer typically includes multiple layout features (cells) that may be arranged in blocks (i.e., groups of cells related, e.g., by way of being part of a single component or circuit), where each cell is typically described by data indicating its size/shape and its designated X,Y location in an associated layer. FIGS. 4(A) to 4(C) depict the generation and processing of a design layout workspace 110 including cells C01 to C18 of a hypothetical simplified layer 90-1 of IC layout design 90, where FIG. 4(A) is a graphic representation of an initial design layout workspace including all cell information associated with layer 90-1 of early-stage IC layout design 90 at a time T10. Note that several simplifications are adopted for the sake of brevity and clarity. First, layer 90-1 is depicted as including eighteen cells C01 to C18 disposed in three rows, where each cell is depicted by an associated square box that is intended to represent the cell's X-Y location and cell-area boundary relative to all other cells in layer 90-1. Those skilled in the art will understand that a typical layer may include a substantially larger number of cells/blocks, and the depiction of eighteen cells is merely a simplification adopted for clarity. In addition, each cell C01 to C18 is understood to include an associated layout detail, or is otherwise designated (e.g., as a dummy cell) in the manner set forth below. Moreover, the novel DRC processing method is described below only with reference to layer 90-1 (i.e., details regarding the processing of the other layers IC layout design 90, e.g., as shown in FIG. 2, are omitted below), and it is understood that the methodology described with reference to the cells of layer 90-1 are utilized to process all of the cells in all layers of IC layout design 90. In one embodiment design layout workspace 110 is configured such that each layer of IC design 90 can be processed separately by DRC tool 90 using the methodology described below.

Referring to block 302 (FIG. 3) and FIG. 4(A), generating design layout workspace 110 involves reading in (transferring) cells C01 to C18 into designated memory space of computing system 101 at a time T10, where cells C01 to C18 collectively define layer 90-1 at a time T10. As indicated in FIG. 4(A), the generation (and subsequent processing) of workspace 110 is performed on computing system 101 using known techniques, and as mentioned above the graphic depiction of cells C01 to C18 is utilized solely for purposes of simplifying the description of the processing techniques performed by DRC tool 100.

Referring to block 305 (FIG. 3) and to FIG. 4(B), certain pre-designated cells (e.g., cells having flags set to indicate them as known-good or dummy cells) are identified and deleted from workspace 110 at a time T11 (i.e., subsequent to time T10). In the example shown in FIG. 4(B), arrows 310A1 and 310A2 indicate the deletion from workspace 110 of dummy cells C01 and C18, which are shown in FIG. 4(A), and arrow 310A3 indicates the deletion of known-good cell C06 (also shown in FIG. 4(A)) from workspace 110. Accordingly, design layout workspace 110(T11) includes a second plurality of cells (i.e., C02 to C05 and C07 to C17) that comprise a subset of the original (first) plurality of cells (i.e., C01 to C18) transferred into workspace 110 at time T10. Those skilled in the art understand that the phrase "dummy cells" refers to blank "placeholder" cell descriptions that occupy designated X-Y locations on a given layer for purposes of reserving the space for subsequent occupation by one or more actual cells of the IC layout design. Known-good cells are cells that have already been processed by DRC tool 100 (e.g., in a previous processing iteration) or are otherwise known not to violate any relevant DRC rule. Removing dummy and known-good cells from workspace 110 reduces DRC processing time by preventing rule checks on these pre-designated cells.

The identification and deletion of pre-designated cells during the processing associated with block 305 may be implemented using various alternative methods. In one embodiment, known-good and/or dummy cells are identified by way of time-stamps or other flag/indicator assigned to selected cells that identifies the cells as candidates for omission from subsequent DRC processing in the current DRC processing session. In a specific embodiment, selected cells of IC layout design 90 are assigned time-stamps indicating the last time the cell was checked by DRC tool 100, and the outcome of that DRC check. That is, each cell present in a first version of an IC layout design that was checked by DRC tool 100 during an initial DRC processing session is assigned time-stamp values indicating (a) the date or revision number of the initial DRC processing session, and (b) whether the cell passed all DRC checks during the initial DRC processing (i.e., known-good), or failed one or more rule checks (bad). The time stamps remain unchanged in all subsequent revisions until the cell is subjected to change (e.g., correction of a detected rule violation in block 240 of FIG. 2). In one embodiment, all cells having time stamps that indicate previous DRC processing and either "known-good" or "bad-no-change" are identified and deleted from workspace 110.

Block 307 (FIG. 3) and FIG. 4(C) depict a novel DRC processing technique involving identifying problematic cells (e.g., cells having problematic instance placements) that are present in layout workspace 110, and flagging (e.g., marking or otherwise designating) the identified problematic cells such that they are omitted (suspended) from first-pass rule check processing, and are identified in the DRC error report using a special DRC error designation (e.g., a "bad placement" error). In the example shown in FIG. 4(C), the suspension of problematic cells C10, C11, C13 and C14 is indicated by way of dashed-line boxes and the designations "PC10/11" and "PC13/14", which indicates that, while DRC processing of these cells is suspended, information related to these cells is retained for possible DRC processing after DRC processing is completed on all non-problematic cells (e.g., as discussed below with reference to block 370). That is, in contrast to the deletion from workspace 110 of information associated with known-good cell C06 and dummy cells C01 and C18, the details of problematic cells PC10/11 and PC13/14 is retained by DRC tool 100. Although problematic cells PC10/11 and PC13/14 are indicated in the present example by way of exhibiting overlap-type bad placement errors for descriptive purposes, it is understood problematic cells may be identified by way of other types of problematic instance placement.

In a presently preferred embodiment, the problematic cell identification process of block 307 is performed during a hierarchy processing portion of the DRC process (i.e., performed before DRC rule check operations), and involves identifying instances of cells that have suspect placements, such as overlapping cells C10 and C11, and overlapping cells C13 and C14. In one embodiment, suspect placements are detected by way of identifying permitted-overlap rules pertaining to a currently selected layer, analyzing the size/location data of each cell in relation to its adjacent neighboring cells, and marking each cell as "problematic" if the cell's size/location violates the layer's permitted-overlap rules. In one embodiment, a layer specific rule runset is modified for a currently selected layer such that the runset includes one or more new rules pertaining to the placement rule violations associated with the problematic cells—as explained below, these new rules may be used to mark cells located adjacent to problematic cells as also being problematic when certain rule violations occur at a high rate in these cells.

Figure 4D:
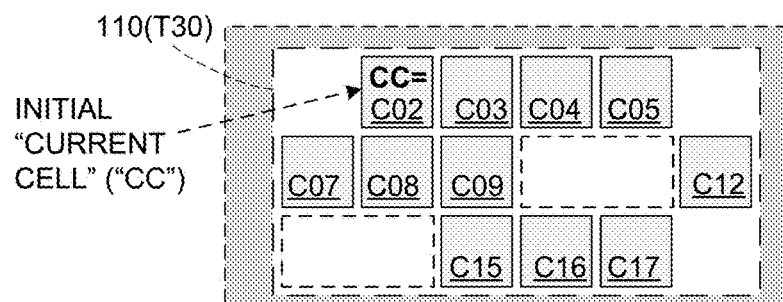

Referring to block 309 (FIG. 3) and to FIG. 4(D), a final operation performed in accordance with the generation of layout workspace 110 is the optional designation of an initial (first) current cell (CR) for DRC processing at a time T30. Referring to FIG. 4(D), in the depicted example cell C02 is indicated as being set as the current cell by way of the designation "CC=C02", whereby cell C02 is identified as the first cell to be processed during subsequent DRC processing. The first cell designation operation associated with block 309 is shown in FIG. 3 for logical and descriptive purposes, and those skilled in the art will understand that an actual "set current cell" operation may be unnecessary in some embodiments. As set forth below, cell C02 is selected as the initial current cell in the exemplary embodiment because it is the lowest numbered remaining "unmarked" cell in workspace 110 at time T30, and in the example the current cell designation is shifted from cell to cell in an ascending cell-number order. Accordingly, an actual "current cell" designation step may be omitted, and DRC processing may simply be initiated using the cell in workspace 110(T30) with the lowest cell number (i.e., cell C02). Of course, other cell ordering schemes may be utilized that may produce different initial current cells. Moreover, some embodiments may not apply all rule checks to all cells. For example, when cells having identical features (e.g., shape, size and orientation) are instantiated multiple times in a given layer, rules used to check cell feature dimensions may be applied to the first instantiation, and omitted/skipped in subsequent instantiations; at the same time, rules that check cell-to-cell boundary offsets may be applied to all instantiations of a cell having identical features).

Figure 5A:
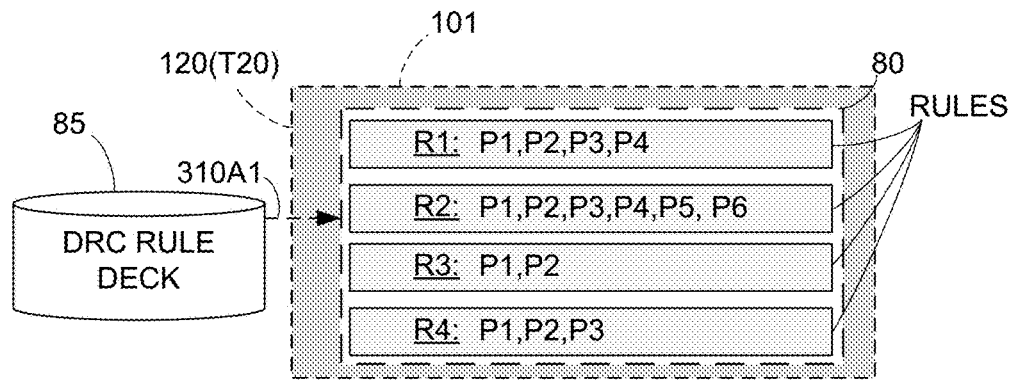
FIGS. 5(A), 5(B) and 5(C) are simplified diagrams depicting DRC rule ordering utilized in the processing method of FIG. 3 according to the exemplary simplified embodiment.
Figure 5B:
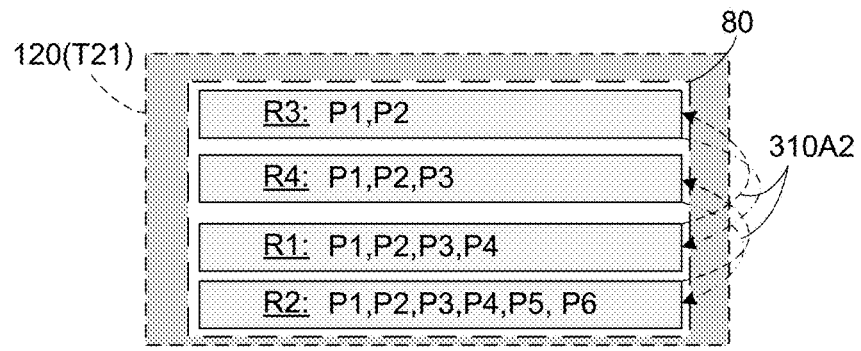

Referring to block 310 in the upper right portion of FIG. 3, a rule check "runset" order is also automatically generated before commencing DRC processing according to another novel processing technique. FIGS. 5(A) and 5(B) depict a simplified example in which DRC rules 80 are written from an external DRC rule deck 85 into a memory file 120, as indicated by arrow 310A1, at a time T20. Memory file 120 forms a part of computing system 101 that is accessible by an associated subroutine of DRC tool 100, which generates a rule check runset order by assigning a rank (cost) value to each DRC rule of DRC rules based on predetermined criteria (e.g., based on pre-established importance of certain rules to a given design layout layer, or based on estimated or calculated rule execution time duration). In the exemplary embodiment DRC rules 80 include rules R1 to R4, where each rule includes associated number of rule check procedures P1 to P6. For explanatory purposes, it is assumed that each procedure P1 to P6 is executed by computing system 101 in the same amount of time (i.e., procedure P1 is executed in the same amount of time as procedures P2 to P6), so the anticipated rule execution time duration for each rule R1 to R4 may be anticipated (i.e., estimated or calculated) by the number of procedures associated with each rule. Using this simplification, the shortest-to-longest runset order for rules R1 to R4 is established as indicated by the arrows 310A2 shown in FIG. 5(B), with rule R3 being identified having the shortest anticipated rule execution time duration by way of including two procedures P1 and P2, and rule R2 being identified having the longest anticipated rule execution time by way of including six procedures P1 to P6. Due to the associated number of procedures utilized by rules R1 (i.e., procedures P1 to P4) and R4 (i.e., procedures P1 to P3), the runset order for DRC rules 80 is set as indicated in FIG. 5(B), with rule R3 being first, R4 being second, R1 being third and R4 being fourth. Accordingly, as established by way of this example, a first DRC rule (i.e., rule R3 or rule R4) having a relatively short anticipated rule execution time duration is assigned a higher rank value (lower cost), and a second DRC rule (i.e., rule R2 or rule R1) having a relatively long anticipated rule execution time duration is assigned a lower rank value (higher cost).

Although the exemplary embodiment describes runset ordering involving analyzing a DRC runset command tree to determine which of the DRC rules are the "simplest", other criteria may be utilized to automatically set the DRC runset order. In another embodiment, the anticipated execution time duration for each rule is based on which of the rules include known time-consuming ('expensive') operations (e.g., connect db, voltage dependent checks, or multi-patterning checks), and the rule runset is ordered in accordance with the presence of such known time-consuming operations such that all rules that omit such time-consuming operations are executed before the rules having the known time-consuming operations. FIG. 6 provides a listing of exemplary rules having associated designated low, medium, medium/high, high and very high cost values based on anticipated execution time. In another embodiment, DRC rules 80 includes a layer-specific rule runset, where rule R1 to R4 includes DRC rules from DRC rule deck 85 and any new rules that may be generated by DRC tool 100, and runset ordering (block 310) involves ranking the rules from lowest-to-highest cost (or highest-to-lowest weight) based on each rule's relevance to the currently selected layer. In this case, if runset order was established during a previous DRC processing session and no new rules have been added, then the previously established runset order may be utilized and block 310 may be skipped to further reduce overall DRC processing time.

Figure 5C:
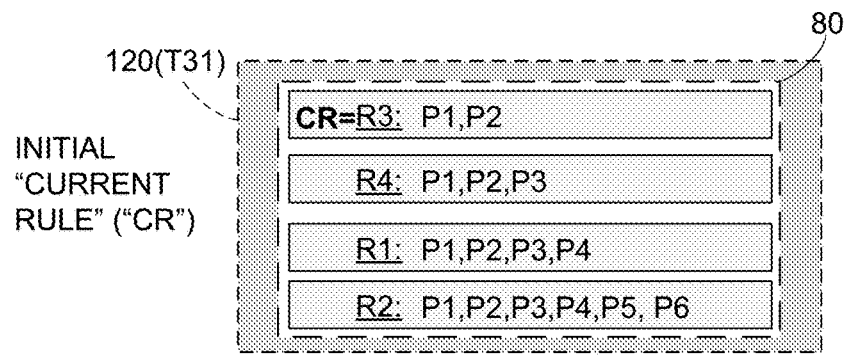

Referring to block 315 (FIG. 3) and to FIG. 5(C), a final operation performed in accordance with the generation of a rule runset order is the optional designation of an initial (first) current rule (CR) for DRC processing at a time T31. Referring to FIG. 5(C), in the depicted example the designation "CR=R3" indicates that rule R3 is set as the initial current rule for subsequent DRC processing because, as set forth above, it has been identified as the lowest duration (shortest running) rule in runset 120. As with the selection of an initial current cell (discussed above), the designation of rule R3 as the initial current rule is depicted for explanatory purposes, and may be omitted in some cases.

Figure 7A:
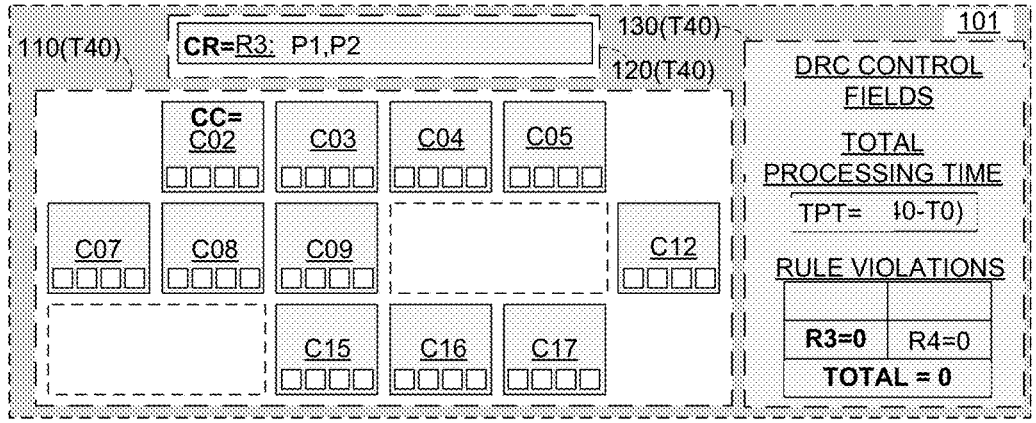
FIGS. 7(A), 7(B), 7(C), 7(D), 7(E), 7(F), 7(G), 7(H), 7(I), 7(J) and 7(K) are simplified diagrams depicting an exemplary operation of the processing method of FIG. 3 using the cell details of FIG. 4(D) and the ordered DRC rules of FIG. 3(C)

After the design layout workspace is generated and the rule runset order is established as set forth above, DRC processing is performed by associated subroutines of DRC tool 100 in accordance with blocks 320 to 380 of FIG. 3 in the manner described below. Note that the simplified cell layout and rule runset examples described above with reference to FIGS. 4(D) and 5(C) are utilized to illustrate specific processes performed by DRC tool 100 during DRC processing in a greatly simplified graphic manner with reference to FIGS. 7(A) to 7(L), which are described below. For example, FIG. 7(A) depicts a portion of computing system 101 including layout workspace 110 and memory file 120 at a time T40, which occurs after both time T30 (FIG. 4(D)) and time T31 (FIG. 5(C)), which indicate the designation of initial current cell C02 and initial current rule R3, respectively. FIG. 7(A) also shows a third memory section 130 at time T40 that is generated and updated by associated subroutines of DRC tool 100, and is made up of DRC control fields including elapsed (total) DRC processing time TPT, which in one embodiment is calculated by subtracting time T0 from time T40 (indicated by "T40−T0"), and error (rule violation) count fields that indicate the number of violations of each rule R1 to R4, along with a sum total value, that have accrued during DRC processing. Of course, at the beginning of DRC processing the rule violation count values are all zero (e.g., "R1=0"). Note that the depictions in these figures are not intended to accurately reflect specific details associated with DRC processing, and details regarding the execution of specific DRC operations known to those skilled in the art (e.g., the rule checks performed in accordance with block 320) are omitted herein for brevity.

Figure 7B:
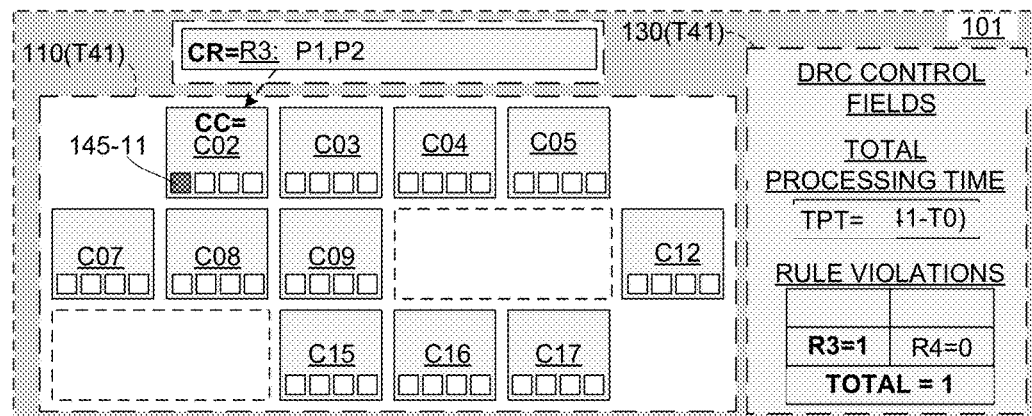

Referring again to block 320 (FIG. 3), rule check processing is initiated by DRC tool 100 at a time T40 by way of performing the initially designated current rule check on the initially designated current cell. As established above, at the beginning of rule check processing the designated current rule is the first rule in the rule runset order (i.e., rule R3), and the designated current cell is the lowest numbered cell in design layout workspace 110 (i.e., cell C02). FIG. 7(B) shows computing system 101 at a time T41 following the first DRC rule check operation involving the application of initial current rule R3 to initial current cell C02. For discussion purposes, the results of this initial rule check are indicated by flag box 145-11 depicted at the bottom of cell C02, where the blacked state of flag box 145-11 indicates that cell C02 failed the rule check involving DRC rule R3. Referring to third memory section 130(T41) at the right side of FIG. 7(B), note that the violation of rule R3 by cell C02 causes the rule R3 violation field in memory section 130 (T41) to increment (increase by one, e.g., such that the associated field changes to "R3=1"), as well as the total rule violation field (i.e., such that the total number of violations field changes to "TOTAL=1"). The relevance of these violation count values is discussed below.

After the initial rule check operation (block 330, FIG. 3), control passes to decision block 330, which functions to identify whether the current rule (in this case, rule R3) has been violated more than a predetermined maximum number of times. Because this is the initial pass through decision block 330 (i.e., the number of violations related to current rule R2 is low), processing follows the "NO" branch to block 340. As explained in additional detail below, in later cycles involving a given current rule, if a high rule violation rate is detected in block 330, the "YES" branch is followed to block 335, where a rate flag is set for the current rule, and the rule checking process for the current rule is suspended.

Resuming with the example involving initial current rule R3, rule check processing proceeds to the next cell in the design layout workspace. In the exemplary embodiment shown in FIG. 3, control passes along the "NO" branch from decision block 330 to decision block 340, which checks to determine if all cells in design layout workspace have been checked using the designated current rule. If unchecked cells remain (NO), then control passes from decision block 340, whereby the designated current cell is updated to a next remaining cell in the design layout workspace, and then control passes to block 320, whereby DRC processing proceeds with performing rule check operations on the newly designated current cell using the previously designated current rule. In a presently preferred embodiment, the above-mentioned loop, which is performed until one of the two conditions mentioned above with reference to decision blocks 330 and 340 is satisfied, is performed in accordance with the rule check runset order a high error rate is not detected (NO), then control passes from the current cell to the next-higher numbered remaining "unmarked" cell in the design layout workspace.

Figure 7C:
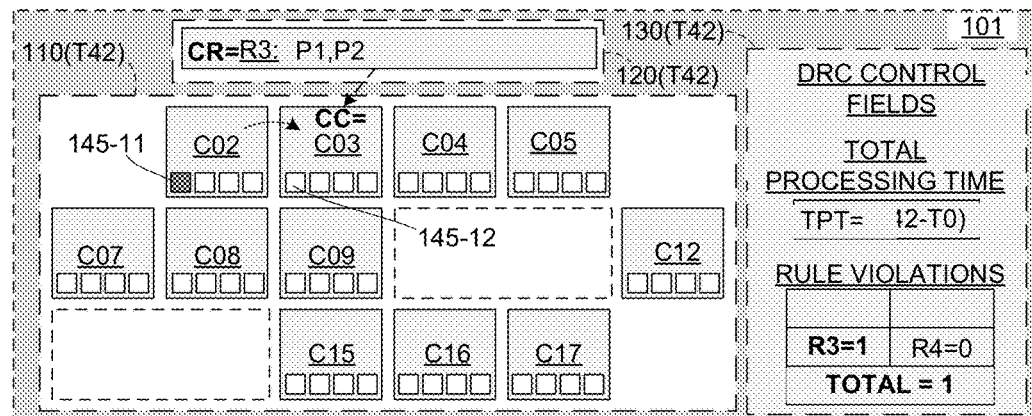
Figure 7D:
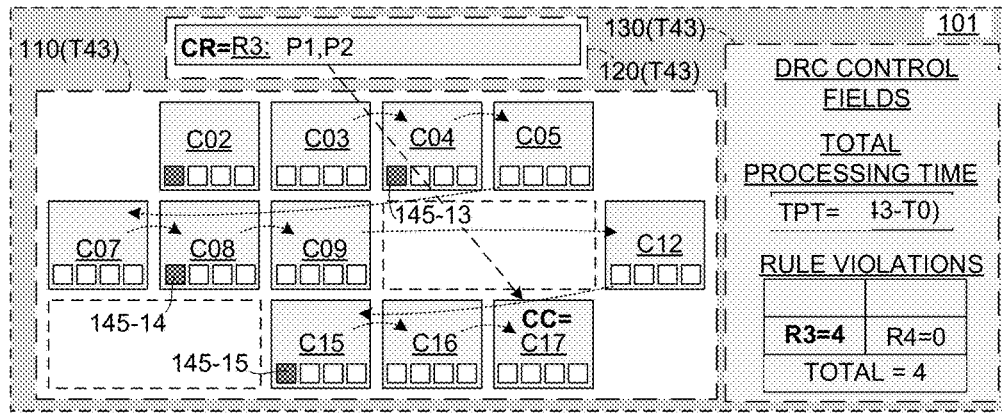

FIGS. 7(C) and 7(D) depict DRC processing of cells C03 to C05, C07 to C09, C12 and C15 to C17 (i.e., the "unmarked" cells in workspace 101) according to the loop process described above with reference to blocks 320, 330(NO), 340 and 345. FIG. 7(C) depicts computing system 101 at a time T42 after the re-designation of the current cell from cell C02 to cell C03 by block 345 of FIG. 3 (i.e., in FIG. 7(C), this in indicated by way of the curved dashed arrow, and the designation "CC=C03" in cell C03), and after re-designated current cell C03 has been subject to DRC processing using current rule R3. For discussion purposes, the results of this second rule check using rule R3 are indicated by flag box 145-12 depicted at the bottom of cell C03, where the open state of flag box 145-11 indicates that cell C03 passed the rule check involving DRC rule C03. Referring to right side of FIG. 7(C), note that the rule R3 violation field and the total violations field in memory section 130(T42) remain unchanged from time T41 (FIG. 7(B)) due to cell C03 passing the rule R3 check. FIG. 7(D) depicts computing system 101 at a time T43 following multiple additional passes through the loop process described above with reference to blocks 320, 330(NO), 340 and 345, where the respective dashed-line arrows indicate sequential shifting of the current cell designation from cell C03 to cell C04, from cell C04 to cell C05, etc., in the increasing cell number order until cell C17 has been designated as the current cell and processed using the rule R3 rule check operation. The cells that violated rule R3 (i.e., cells C04, C08 and C15 failed the rule check process involving rule R3) are indicated the blacked state of flag boxes 145-13, 145-14 and 145-15, respectively, and the open first boxes in all of the other cells indicate that these cells passed the sequentially performed rule check process involving rule R3. Referring to right side of FIG. 7(D), note that the rule R3 violation field and the total violations field in memory section 130(T43) have increased in accordance with the number of cells that violated rule R3 during DRC processing from time T41 to time T43 (i.e., such that the number of rule 3 violations field now reads "R3=4", and the total number of violations field changes now reads "TOTAL=4").

Figure 7E:
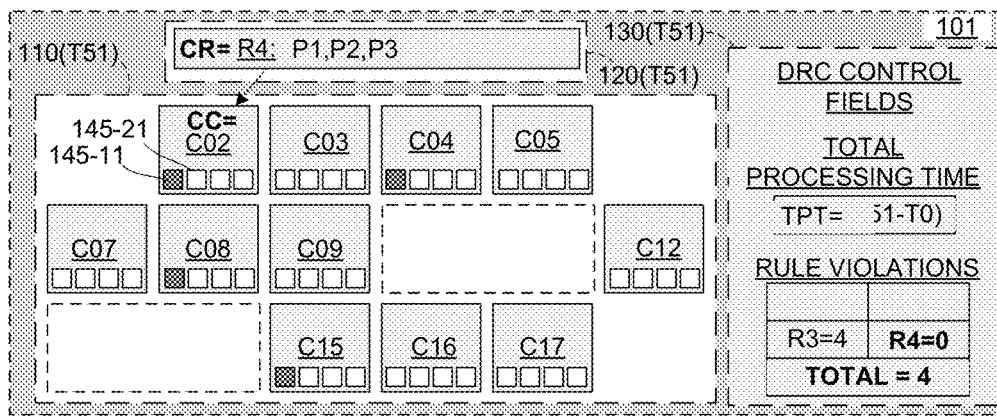
Figure 7F:
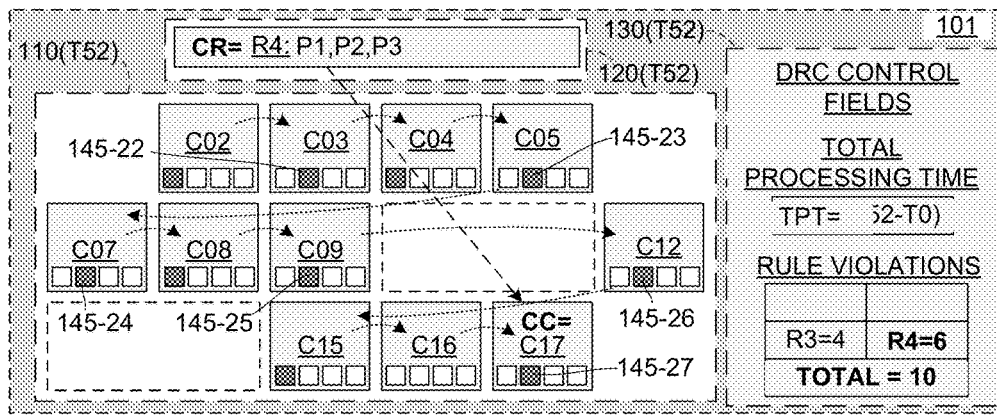

Returning again to decision block 340 in FIG. 3, after all cells in the design layout workspace have been subjected to rule checking using initial current rule (i.e., rule R3), control passes along the "YES" branch to decision block 350, which determines whether one or more of the preset threshold limits (e.g., either the predetermined time limit or the predetermined number of total rule violations). For descriptive purposes, it is assumed neither of these thresholds have been reached, so control passes along the "NO" branch to block 355, where the current cell is reset to the first remaining cell (i.e., cell C02 in the example shown in FIG. 7(E)), and then control passes to decision block 360, which determines whether all rules in memory space 120 have been checked. Because only one rule (i.e., rule R3) has been checked at this time, the next rule in the rule runset order (i.e., rule R4) is designated as the current rule. FIG. 7(E) depicts computing system 101 at a time T51 following a first DRC rule check operation involving the application of second current rule R4 to initial current cell C02. For discussion purposes, the results of this rule check are indicated by second flag box 145-21, which is depicted next to flag box 145-11 at the bottom of cell C02, where the open state of flag box 145-21 indicates that cell C02 passed the rule check involving DRC rule R4. Because cell C02 passed the rule checking operation involving rule R4, the rule R4 violation field in memory section 130(T41) remains unchanged (i.e., "R4=0"), and the total rule violation field also remains unchanged (i.e., "TOTAL=4") from the tally generated by DRC processing using initial rule R3. FIG. 7(F) depicts the subsequent DRC processing of unmarked cells C03 to C05, C07 to C09, C12 and C15 to C17 according to the loop process described above with reference to blocks 320, 330(NO), 340 and 345 in FIG. 3. Specifically, FIG. 7(F) depicts computing system 101 at a time T52 after multiple additional passes through the loop process described above with reference to blocks 320, 330(NO), 340 and 345, where the respective dashed-line arrows indicate sequential shifting of the current cell designation from cell C02 to C03, from C03 to cell C04, etc., in the increasing cell number order until cell C17 has been designated as the current cell and processed using rule R4. The cells that violated rule R4 (i.e., cells C03, C05, C07, C09, C12 and C17) are indicated the blacked state of flag boxes 145-22, 145-23, 145-24, 145-25, 145-26 and 145-27, respectively, and the open first boxes in all of the other cells indicate that these cells passed the sequentially performed rule check process involving rule R4. Referring to right side of FIG. 7(F), note that the rule R4 violation field and the total violations field in memory section 130(T52) have increased in accordance with the number of cells that violated rule R4 between times T51 and T52 (i.e., such that the number of rule 4 violations field now reads "R4=6", and the total number of violations field changes now reads "TOTAL=10").

In one embodiment DRC tool 100 is configured to automatically detect systematic or fundamental layout errors by way of recognizing when a particular DRC rule generates an unusually high number of rule violations, and for terminating the rule check process involving the particular DRC rule, but continuing rule check processing using subsequent rules in the rule deck. As set forth above, recognition of a high error rate associated with a particular current rule occurs in decision block 330 (FIG. 3). A simplified example illustrating the termination of rule check processing is provided below with reference to rule check processing involving rule R1, where the test performed in decision block 330 generates a "YES" result when seven rule violations are detected for a given rule. Note that seven is an arbitrary number selected solely for descriptive purposes. In one embodiment, an additional function is performed in association with block 330 that evaluates the results generated by lower cost rules, and optionally modifies the rule runset in accordance with this evaluation. In the exemplary embodiment described below, the evaluation results are assumed to cause rule check processing using the full runset. In an alternative embodiment, the evaluation results may be used to truncate a portion of the rule runset (e.g., only perform rule check operations using predesignated low-cost rules), or to remove certain groups of cells from further rule checking (e.g., by way of designating these cells as problematic) due to the generation of too many errors within this group.

Figure 7G:
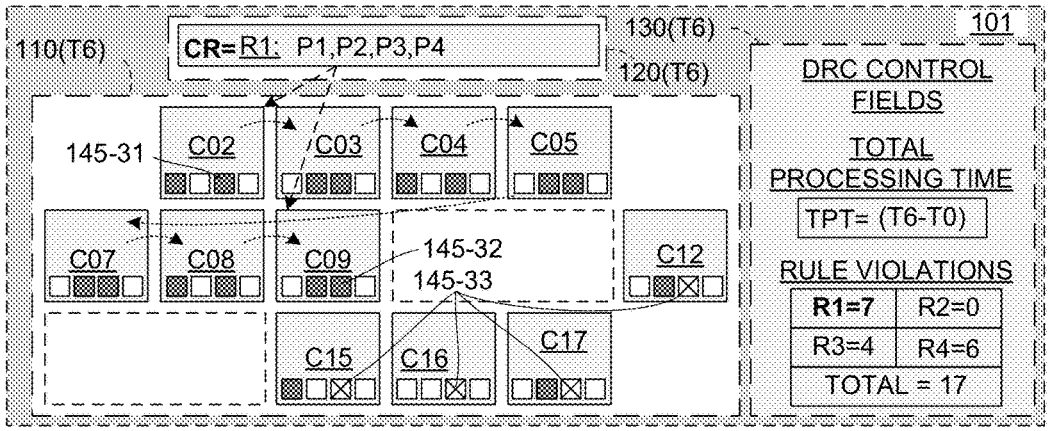

Returning again to decision block 340 in FIG. 3, after all cells in the design layout workspace have been subjected to rule checking using the second rule in the runset (i.e., rule R4), and assuming neither of the time or the total rule violations thresholds have been reached, control again passes from decision block 350 to block 355, where the current cell is again reset to cell C01, and then control again passes through decision block 360 to block 365, where the next (third) rule in the rule runset order (i.e., rule R1) is designated as the current rule. FIG. 7(G) depicts computing system 101 at a time T6 following a series of DRC rule check operations involving the application of third current rule R1 to cells C02 to C05 and cells C07 to C09. The change of the current rule to rule R1 is depicted in memory section 120(T6) of FIG. 7(G) by way of the designation "CR=R1", where performing rule checks associated with rule R1 involve performing rule check procedures P1 to P4.

By way of illustrating the high rule error rate feature, rule checking associated with rule R1 is depicted in FIG. 7(G) as generating seven consecutive errors (rule violations) in each of the first seven cells to which it is applied. That is, rule check processing of cell C02 using current rule R1 is assumed for exemplary purposes to generate a violation, which is indicated by black box 145-31. The designated current cell is then shifted and the rule checking process is repeated for each of cells C02 to C05 and C07 to C09 in the manner described above (i.e., by way of looping through blocks 320, 330, 340 and 345 in FIG. 3), where rule check processing performed in block 320 on each of these cells using current rule R1 generates a violation, as indicated by the black boxes in each of these cells, but in each case control passes from subsequent block 330 ("NO") to block 340 because the total number of rule violations associated with rule R1 remains below the seven-error threshold value. After the rule check processing on cell C09 generates a seventh rule violation related to rule R1 (e.g., as indicated by black box 145-32 in cell C09 in FIG. 7(G)), control passes from block 320 to block 330 in the manner described above. At this point, because seven rule violations have been recorded (as indicated by "R1=7" in memory section 130

Figure 7H:
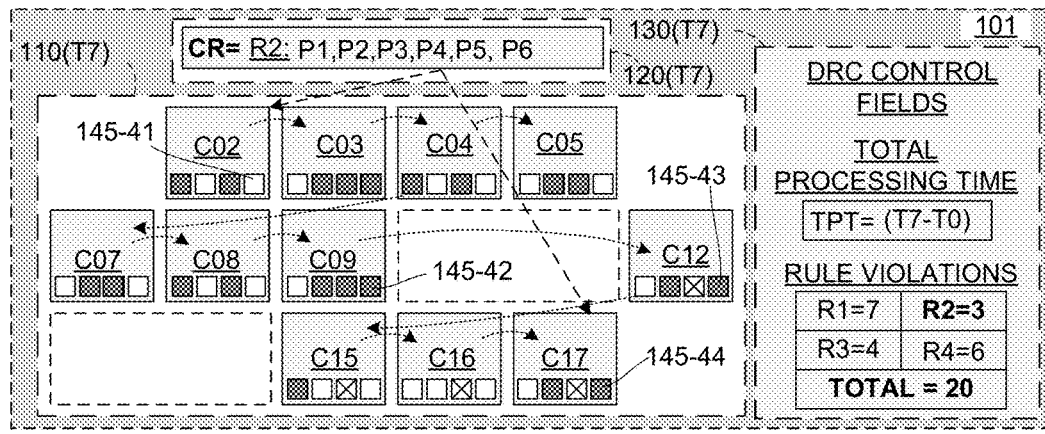

(T6) of FIG. 7(G)), control passes from decision block 330 along the "YES" branch to block 335, whereby a high rule violation rate flag is set for the current rule (i.e., rule R1), and then control passes to decision block 350, which determines whether one or more of the predetermined time limit or total rule violation thresholds have been reached. If not, then control passes to blocks 335, 360 and 365 in the manner described above such that rule check processing continues with next rule in the runset (i.e., rule R2, as indicated in FIG. 7(H)). In this manner, further rule check processing using a high-violation-rate-causing rule (i.e., in this example, rule R1) is postponed or terminated in that subsequent cells in the design layout workspace (i.e., cells C12 and C15 to C17) are bypassed (not subjected to rule check processing using rule R1, as indicated by the "X" symbol appearing in the associated third flag boxes 145-33 of these cells), thereby enabling rule check processing using the next-in-order DRC rule (i.e., in the example, DRC rule R2) at an earlier time than if rule check processing were performed on the bypassed cells. In this way, DRC tool 100 facilitates periodic sanity checks for systematic or fundamental layout flaws that produce a high number of violations of a certain DRC rule. That is, when a particular rule check generates a large number of violations after rule checking a relatively small number of cells, DRC tool 100 assumes that the particular DRC rule will probably generate an additional large number of violations when applied to the remaining cells of a given layer, and suspends further rule check processing using that particular DRC rule in order to provide more time for rule checking using other DRC rules. In one embodiment, further rule checks using the particular high-violation-rate-causing rule or in the high-error-rate-producing region are postponed until first-pass DRC processing is completed for all other rules and/or layers of the IC layout design (i.e., if sufficient time budget remains after all other rule checks are completed, then the remaining time budget may be used to apply the rule check to cells that were not checked using the particular rule). When the DRC process is completed before the particular rule check is applied to all cells, the error report may include a special error message identifying the high-error-rate-causing rule and/or the high-error-rate-producing region, which notifies the operator/user that violations of the particular rule may be present in other regions of the layout design.

Referring to FIG. 7(H), which depicts computing system 101 at a time T7 (following time T6) after a series of DRC rule check operations involving the application of subsequent (and final) current rule R2 to the cells in design layout workspace 110. The change of the current rule to rule R2 is depicted in memory section 120(T7) of FIG. 7(H) by way of the designation "CR=R2", and the sequentially performed rule check processes using rule R2 are indicated by the curved dashed-line arrows, which indicate that a first rule check process is performed on cell C02 (which rule check is passed, as indicated by open flag box 145-41), and that three cells failed associated subsequently performed rule check processes (i.e., as indicated by blackened flag boxes 145-42, 145-43 and 145-44 in cells C09, C12 and C17, respectively). As indicated in memory section 130(T7), the three violations of rule R2 are recorded (i.e., "R2=3"), and the total rule violation field is updated to include the total number of rule violations incurred at time T7 (i.e., including the seven rule violations incurred by rule R1 such that the total number of violations field changes to "TOTAL=20").

Referring to FIG. 3, once all cells in workspace 110 have been checked using the last rule in the runset, control again passes to block 350 (i.e., along the "YES" branch from block 340). Assuming the total elapsed processing time at the end of time T7 (i.e., "TPT=T7−T0") is less than the DRC time threshold and the total number of rule violations (i.e., "TOTAL=20") is less than the rule violation threshold number, then control passes along the "NO" branch from decision block 350 to block 355, where the current cell is again reset to C02, and then control passes to decision block 360. At this time, since all rules in the runset have been checked, control passes from decision block 360 along the "YES" branch to block 370. The passing of control to block 370 marks the end of first-pass rule checking operations involving unmarked cells, and the beginning of second-pass rule checking operations, which is described below.

As explained above with reference to FIG. 3, DRC tool 100 is configured to perform first-pass rule check processes in the manner described above, where the first-pass rule check processes are only performed on "un-marked" cells that are remaining in the design layout workspace. That is, referring to blocks 305 and 307 (FIG. 3), dummy/known-good and problematic cells are identified and removed from the design layout workspace before first-pass rule check operations are started, whereby these cells are omitted/suspended from first-pass rule checking operations (i.e., referring to FIG. 7(H), the first-pass rule checking operations described above are performed only on remaining cells C02 to C05, C07 to C09, C12 and C15 to C17 of design layout workspace 110). Control passes to block 370 only when all first-pass rule checking operations have been completed on all remaining (unmarked) cells present in the design layout workspace, and only if neither of the DRC time threshold and the total number of rule violations threshold have been reached, meaning that a DRC processing budget remains for performing additional rule checking operations. According to an embodiment of the present invention, this remaining DRC processing budget is utilized to perform at least some second-pass rule checking operations on at least some of the problematic cells identified and removed/suspended in accordance with block 307. The reason and benefit for performing these second-pass rule check operations is that additional rule check processing of the problematic cells may provide additional information that may be acted upon (corrected) before the next DRC processing session is undertaken (i.e., on an incrementally modified version of the IC design layout)—that is, because the DRC tool is able to fully process all unmarked cells without exceeding either the time threshold or the total-error threshold, additional processing of the problematic cells during second-pass rule checking operations is essentially "free".

Figure 7I:
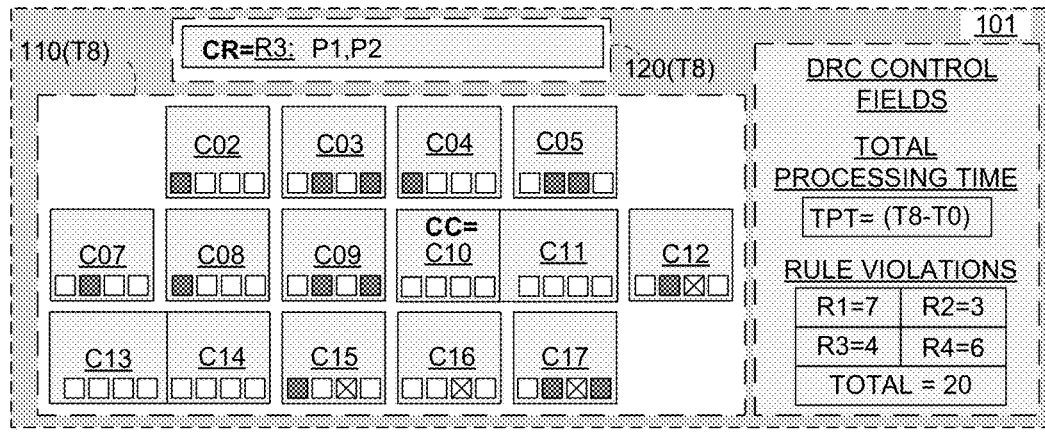
Figure 7J:
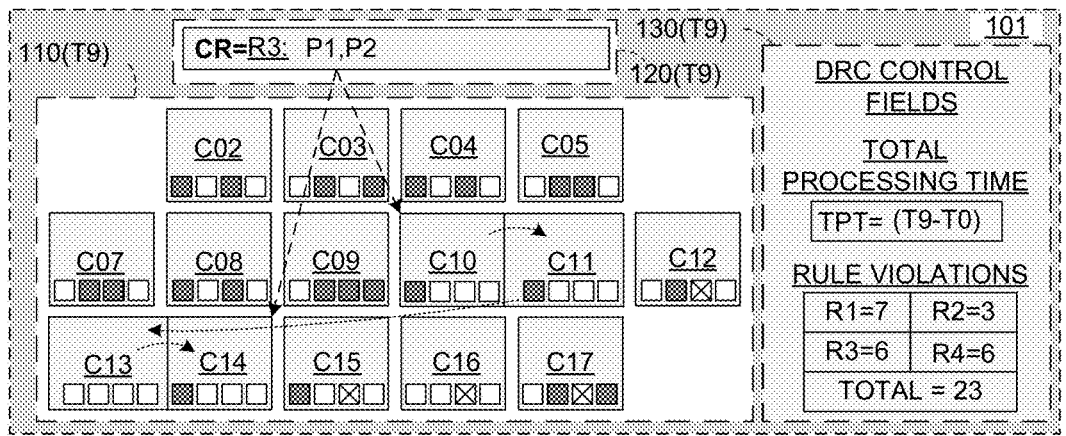
Figure 7K:
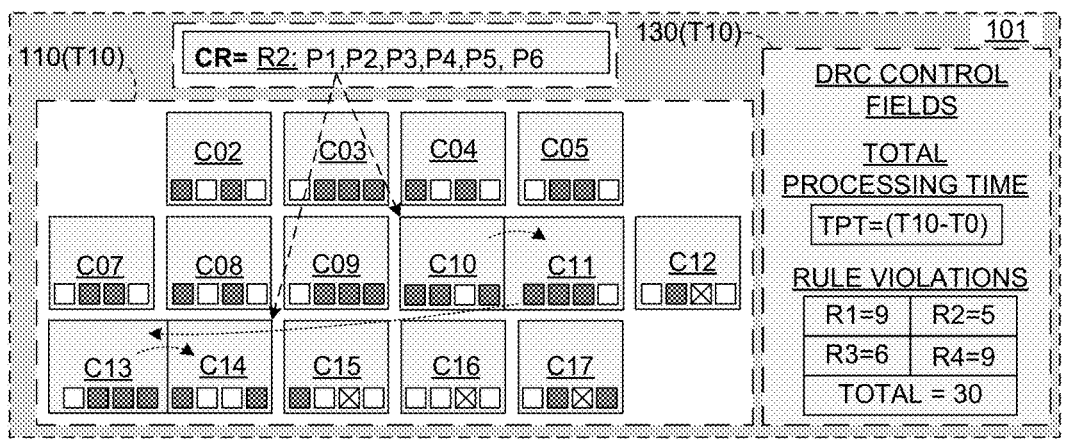

Referring to block 370 (FIG. 3) and to FIG. 7(I), which shows computing system 101 at a time T8, the first phase of the second-pass rule checking operations effectively involves un-flagging (i.e., re-writing or otherwise reinstating) problematic cells C10, C11, C13 and C14 such that they are recognized by DRC tool 100 as unmarked remaining cells in design layout workspace 110(T8). The unmarking process is depicted in FIG. 7(I) by way of showing cells C10, C11, C13 and C14 with the same solid lines and four flag boxes that are used to illustrate the remaining unmarked cells processed during first-pass rule check processing. Note that, in one embodiment, these remaining unmarked cells are removed from the design layout workspace before the start of second-pass rule check operations, but are retaining in the illustrated example for reference. Next, as indicated in FIG. 7(I), the lowest numbered unprocessed cell (i.e., cell C10) is designated as the current cell (i.e., by way of "CC=C10"), and as indicated in second memory section 120(T8), the current rule is reset to the first rule in the rule runset order (i.e., indicated by "CR=R2"). Second-pass rule-check operations are then performed on each of cells C10, C11, C13 and C14 using the methods described above, beginning with initial current rule R3 at a time T10, as illustrated in FIG. 7(J), and ending with final current rule R2 at time T10, as illustrated in FIG. 7(K). In one embodiment, the additional rule violations detected during second-pass rule check operations are indicated using the black/open box method described above, and rule violations are recorded in third memory section 130 in the manner described above, with final rule violation count values being indicated in FIG. 7(K).

In one embodiment, when a "new" DRC rule generated in association with the identification of problematic cells (i.e., in block 307, FIG. 3) is violated during first-pass rule check processing at a high rate by "neighboring" cells that are located adjacent to the identified problematic cells, one or more similarly positioned neighboring cells (e.g., located adjacent to the problematic cells) are automatically designated as problematic and removed from subsequent first-pass rule check processing in order to speed up rule check processing of other remaining cells. Other instances where groups of cells (regions) are designated as problematic during first-pass rule check processing are also mentioned above. When such newly-designated problematic (neighboring) cells are identified and removed during first-pass processing, these newly-designated problematic cells are also reinstated for second-pass rule check processing (i.e., the neighboring cells are reinstated for second-pass rule checking operations along with the originally-designated problematic cells identified and removed in accordance with block 307).

Figure 7L:
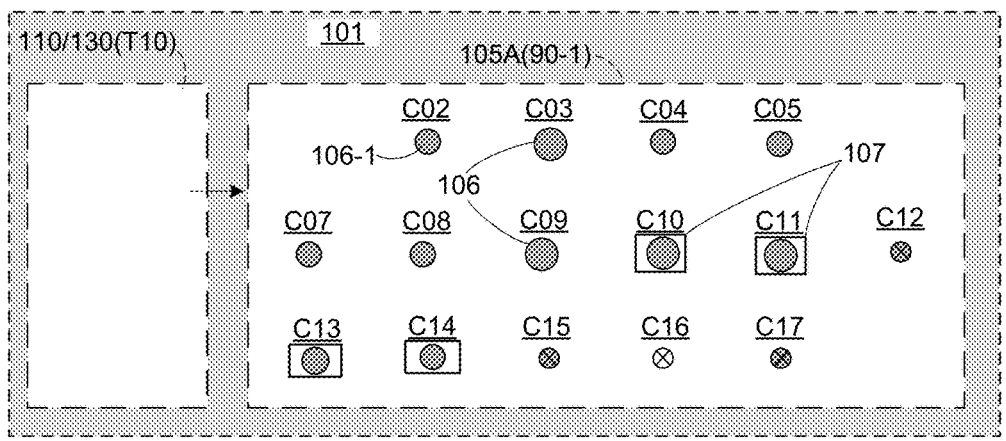
FIG. 7(L) is a diagram depicting exemplary graphic error data associated with a simplified thermal map-type error report generated in accordance with the operations performed in accordance with FIGS. 7(A) to 7(K)

Referring to block 350 in the middle of FIG. 3, upon termination or completion of the DRC process (i.e., either terminated by one of the report thresholds mentioned above or completion of second-pass rule check processing, control passes along the "YES" branch from block 350 to block 380, where error report 105 is generated as set forth below, and then DRC processing is terminated. FIG. 7(L) depicts a simplified error report 105A including error data for layer 90-1, which is based on X-Y positional data of remaining cells in design layout workspace 110 and third memory section 130 at time T10, where error information provided in error report 105A includes (first) graphic error data 106 indicating each rule violation occurring during first-pass rule check processing, and (second) DRC error data 107 indicating each problematic cell identified in block 307 of FIG. 3. In a presently preferred embodiment, DRC tool 100 includes a subroutine configured to generate graphic error data 106 in the form of dots (i.e., spherical or other indicia) that depict each corresponding designated cell having at least one rule violation (i.e., incurred during first-pass and/or second-pass rule checking operations, described above). Each dot is relatively positioned at an X-Y location that corresponds to the relative X-Y location of its corresponding designated cell. For example, the dot 106-1 corresponding to cell C02 is positioned in the upper left corner of graphic error data report 105A, which corresponds to the X-Y location of cell C02 on layer 90-1 (e.g., as indicated in FIG. 4(A)). By providing the error report using this graphical format, DRC tool 100 presents DRC errors to users/operators in a way that is easy to understand and visualize. In addition, an optional textual error report (not shown) is generated that includes details regarding the rule violations depicted by each corresponding dot (e.g., cell number, rules violated, and other information such as whether certain rules were not executed). In another embodiment, error data 107 identifies problematic cells, e.g., using rectangular boxes and/or soft links to error data that details the detected erroneous placement associated with each problematic cell.

Figure 8A:
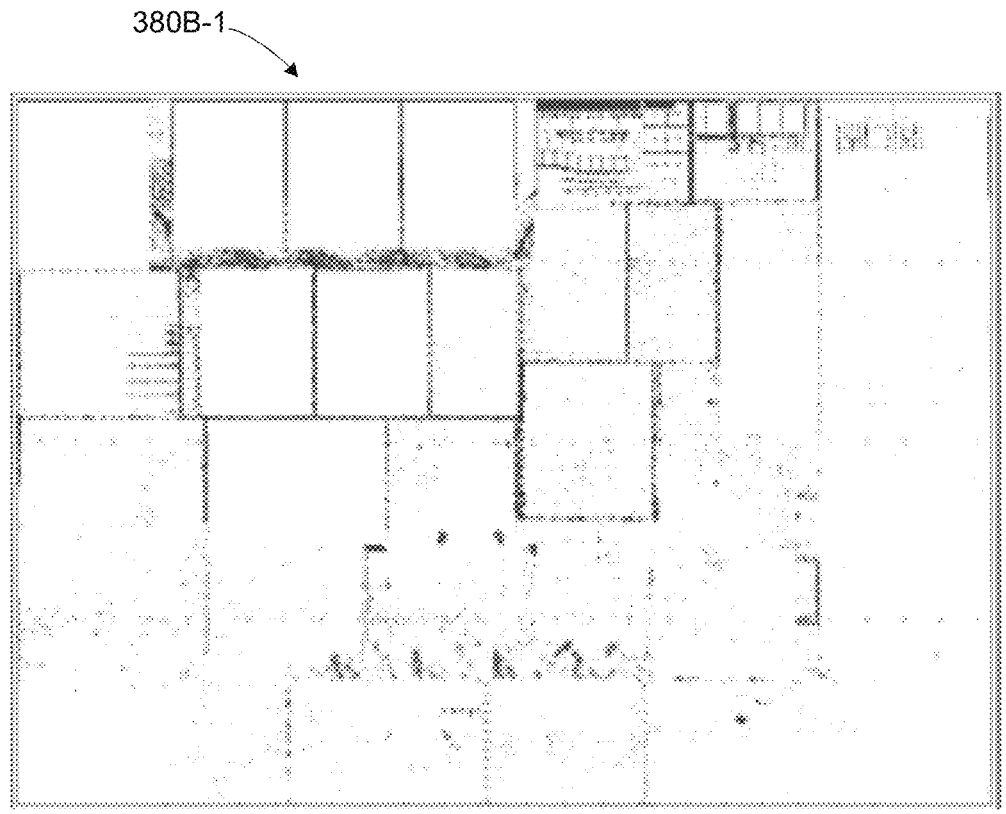
FIGS. 8(A) and 8(B) illustrate thermal map presentations of DRC error results using a sampling method according to another embodiment of the present invention.
Figure 8B:
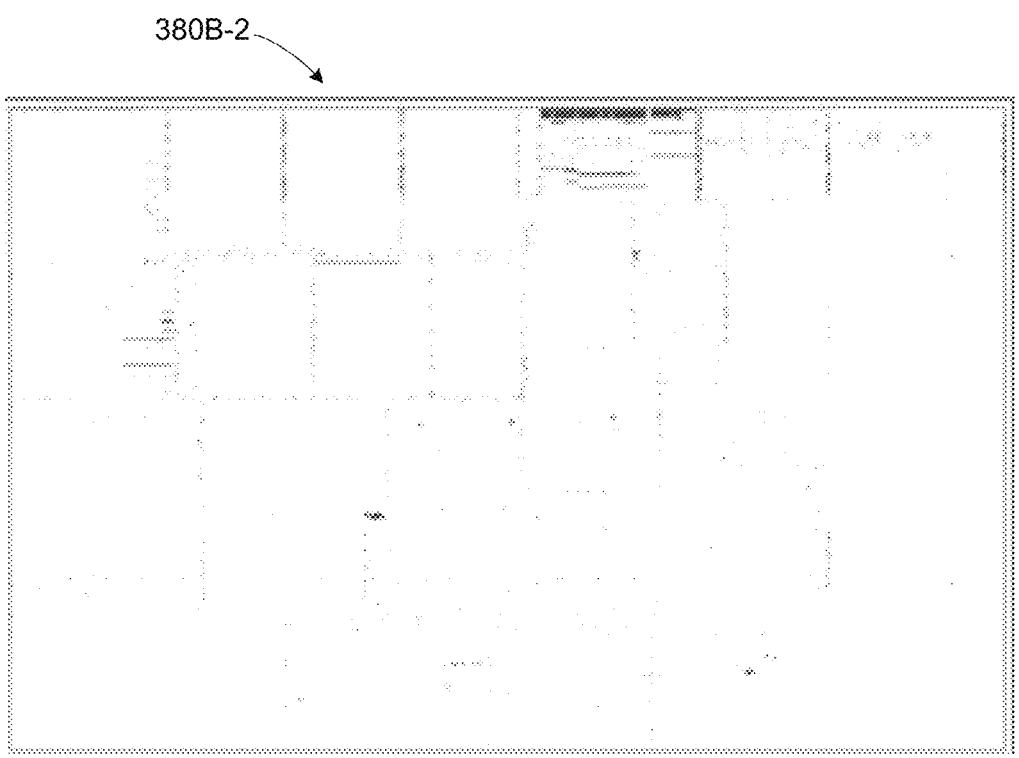

FIGS. 8(A) and 8(B) includes two diagrams 380-B1 and 380B-2, respectively, showing DRC errors generated by DRC tool 100 according to an exemplary practical embodiment, wherein diagrams 380-B1 and 380B-2 depict graphic error data using the thermal map-type graphical presentation method discussed above. Diagram 380-B1 (FIG. 8(A)) is a thermal map presentation showing DRC processing results in which all rule violations (errors) are depicted by corresponding dots. Diagram 380-B2 (FIG. 8(B)) is modified thermal map presentation showing the same DRC processing results of diagram 380-B1, but in a manner that applies a sampling method to reduce the number of displayed errors in accordance with another embodiment of the present invention. In one embodiment, the sampling method applies one or more of the following rules when generating the modified thermal map presentation: at least one error in every block of the layer is shown; and errors are shown uniformly (i.e., the density of displayed errors/dots is uniformly maintained across the entire thermal map), which involves determining the total number of errors and selecting errors to display/hide accordingly. Reducing the errors displayed in the thermal map produces two main benefits: first, it reduces the amount of data that the thermal map generating tool would have to load, so it speeds up the thermal map display generation time; second, it reduces the amount of data presented to the user so it will be easier/faster/more intuitive for the user to understand what needs to be fixed. In one embodiment the sampling method is utilized to generate manageable textual error reports made up textual descriptions of the errors selected by the sampling method.

Figure 9:
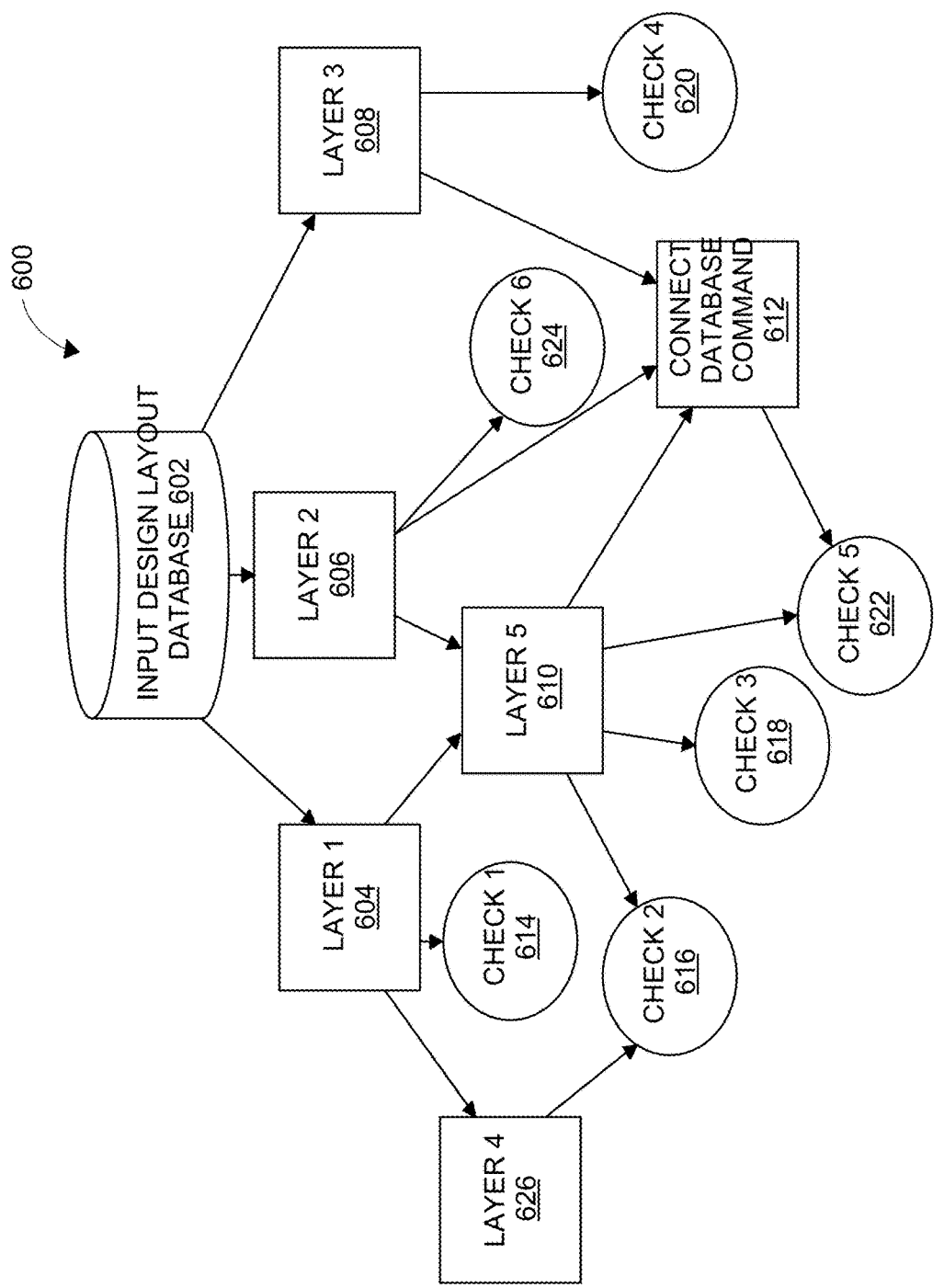
FIG. 9 is a list showing exemplary command set dependencies according to a simplified alternative embodiment of the present invention.

In one embodiment, DRC tool 100 is modified as follows for application to early-stage IC layout designs including multiple layers. In this case, each layer is provided with a layer-specific runset, which includes all DRC rules from the DRC rule deck and any "new" rules that may be generated during DRC processing. According to an embodiment of the invention, the rules/checks for each layer are ranked from lowest-to-highest "cost" (or highest-to-lowest "weight") based on: (a) each rule's relevance to the currently selected layer, and (b) each rule's anticipated execution time (e.g., based on number of command steps). One way to determine a rule's relevance involves determining the DRC rules that are closest to the currently selected design layer in terms of the number of commands in the rule branch, such as the exemplary simplified rule branch depicted in FIG. 9. FIG. 9 illustrates a typical command runset dependency graph 600 comprising an input design layout database 602, layer creation commands layer 1 604, layer 2 606, layer 3 608, layer 4 626, layer 5 610, connect database command 612 and design rule checks rule-check-1 614, rule-check-2 616, rule-check-3 618, rule-check-4 620, rule-check-5 622, and rule-check-6 624. The steps can number in the thousands of DRC tool commands, and these steps may also be intermingled. The checks are the error producing commands that generate errors that are written to the DRC error database. In this example rules-checks 1, 4, and 6 are operating directly on design database derived layers 1, 2 and 3, respectively. Specific rules/checks associated with those referenced with reference to FIG. 9 are listed in FIG. 6, mentioned above. In one embodiment, a given layer's runset order was established during a previous DRC processing session and no new rules have been added, then the previously established runset order may be utilized and block 310 (FIG. 3) skipped to further reduce processing time.

Figure 10:
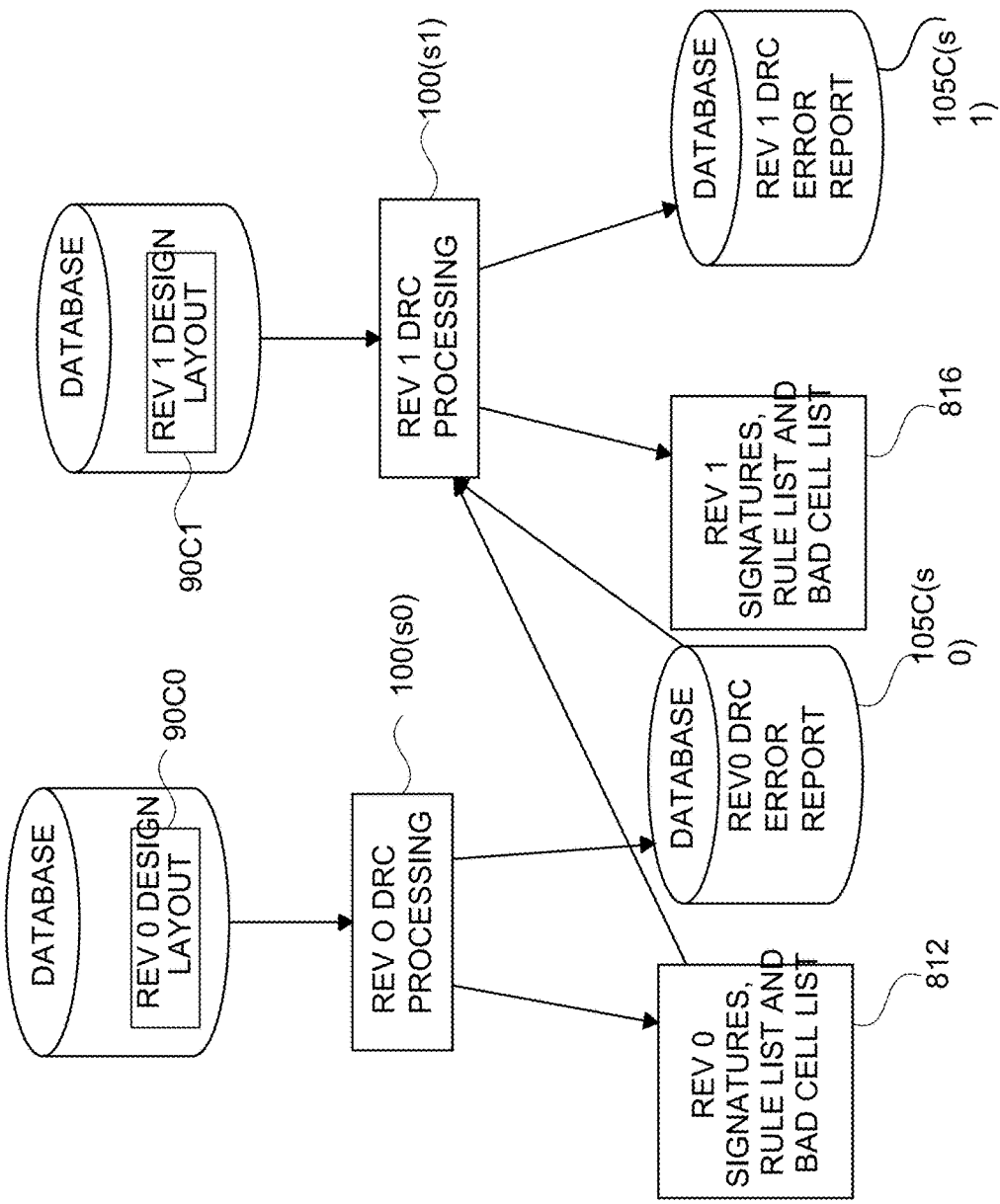
FIG. 10 illustrates an embodiment of incremental re-verification according to another embodiment of the present invention.

FIG. 10 illustrates an incremental IC layout design re-verification method utilizing DRC tool 100 according to another embodiment of the present invention. Incremental re-verification of an IC layout design occurs each time the design is modified, for example, to include previously omitted blocks or to correct rule violations that were detecting during previously performed DRC processing sessions. In the example shown in FIG. 10, an initial "Rev0" layout design 9000 is analyzed during a first DRC processing session s0 by DRC tool 100 (indicated by "100(s0)" in FIG. 10), and information generated during DRC processing session s0 is saved (e.g., signatures, rule list and bad cell list 812, and a Rev0 error report 105C(s0) that may be utilized to generate a graphic thermal map presentation of errors detected during first DRC processing session s0 in the manner described above). At a subsequent time, a modified "Rev1" layout design 90C1 is presented to DRC tool 100 for performance of a second DRC processing session s1 (indicated by "100(s1)" in FIG. 10). In one embodiment, at the beginning of DRC processing session s1, differences between modified layout design 90C1 and the initial (dirty) layout design 90C0 are automatically identified, for example, using time-stamp values to distinguish between new or modified features in modified layout design 90C1 that are different from or not present in dirty layout design 90C0, and then DRC processing is performed only on the new or modified features (i.e., 'has-not-changed' features are not subjected to the rule checking process). Information generated during session s1 is combined with residual (unchanged) information generated during session s0, and the combined information is then saved (e.g., as signatures, rule list and bad cell list 814, and a Rev1 error report 105C(s1)) for use in during the next-sequentially performed DRC processing session. Accordingly, by automatically identifying and removing unchanged features in incremental revisions of an IC layout design, the incremental re-verification method of the present invention minimizes DRC processing time by performing rule checking only on new or modified features (i.e., features that were changed from previous revisions) appearing in each incremental IC layout design revision, which further increases the DRC processing efficiency of DRC tool 100. DRC processing is thus focused on the new and modified portions of each new IC layout version until all functional blocks have been added, all corrections to rule violations detected during all early-stage DRC processing iterations have been entered, and signoff DRC processing is successfully performed on the final IC layout design. In summary, an objective of the DRC tool of the present invention is to focus each DRC processing iteration on cells/blocks/layers that are either newly added or corrected relative to the earlier IC layout version, thereby significantly reducing overall processing time from early-stage to signoff DRC processing, in comparison to the processing time required using conventional signoff DRC methods.

Figure 11:
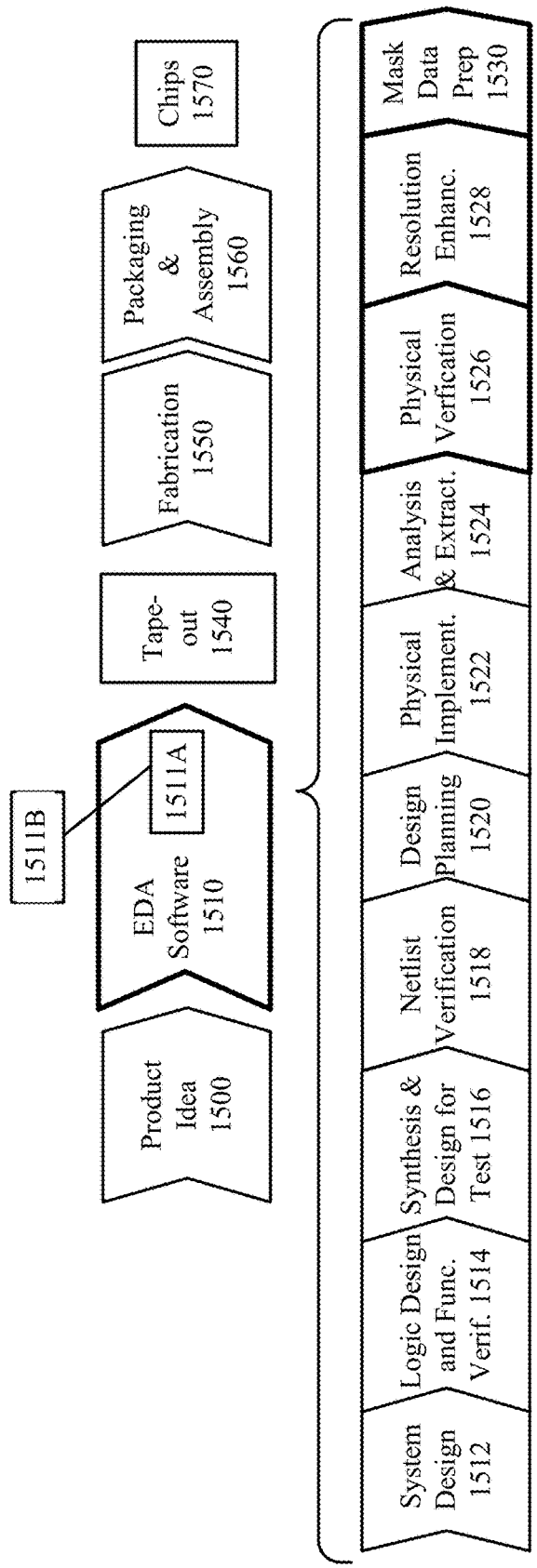
FIG. 11 shows a simplified representation of an exemplary digital ASIC design flow including the DRC processing method of the present invention.

FIG. 11 shows a simplified representation of an exemplary digital ASIC design flow including the DRC processing approach described above. At a high level, the process starts with the product idea (step 1500) and is realized in an EDA software design process (step 1510). When the design is finalized, it can be taped-out (event 1540). After tape out, the fabrication process (step 1550) and packaging and assembly processes (step 1560) occur resulting, ultimately, in finished chips (result 1570).

The EDA software design process (step 1510) is actually composed of a number of steps 1512-1530, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components/steps of the EDA software design process (step 1510) will now be provided. In one embodiment, one or more steps of the EDA software design process can be implemented using a computer-readable medium 1511A, which is read by a computer 1511B. Note that CustomSim, ESP, IC Compiler, Magellan, Model Architect, Power Compiler, PrimeRail, Proteus, ProteusAF, PSMGen, Saber, StarRC, and System Studio are trademarks of Synopsys, Inc., and CATS, DesignWare, Design Compiler, Formality, HSIM, Leda, NanoSim, Primetime, Syndicated, TetraMAX, VCS, and Vera are registered trademarks of Synopsys, Inc. System design (step 1512): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect™, Saber™, System Studio™, and DesignWare® products.

Logic design and functional verification (step 1514): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include HSIM®, NanoSim®, CustomSim™, VCS®, VERA®, DesignWare®, Magellan™, Formality®, ESP™ and LEDA® products.

Synthesis and design for test (step 1516): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler™, Tetramax®, and DesignWare® products.

Netlist verification (step 1518): At this step, the netlist is checked for compliance with timing constraints and for correspondence with the VHDL/Verilog source code. Exemplary EDA software products from Synopsys, Inc. that can be used at this step include Formality®, PrimeTime™, and VCS® products.

Design planning (step 1520): Here, an overall floorplan for the chip is constructed and analyzed for timing and top-level routing. Exemplary EDA software products from Synopsys, Inc. that can be used at this step include Astro™ and IC Compiler™ products.

Physical implementation (step 1522): The placement (positioning of circuit elements) and routing (connection of the same) occurs at this step. Exemplary EDA software products from Synopsys, Inc. that can be used at this step include the Astro™ and IC Compiler™ products.

Analysis and extraction (step 1524): At this step, the circuit function is verified at a transistor level, this in turn permits what-if refinement. Exemplary EDA software products from Synopsys, Inc. that can be used at this step include PrimeRail™, Primetime®, and Star RC products.

Physical verification (step 1526): At this step various checking functions are performed to ensure correctness for: manufacturing, electrical issues, lithographic issues, and circuitry. Exemplary EDA software products from Synopsys, Inc. that can be used at this step include the Hercules™ and IC Validator products. In one embodiment, the DRC processing tool and method described herein are utilized in step 1526.

Resolution enhancement (step 1528): This step involves geometric manipulations of the layout to improve manufacturability of the design. Exemplary EDA software products from Synopsys, Inc. that can be used at this step include Proteus™, ProteusAF™, and PSMGen™ products. In one embodiment, the DRC processing tool and method described herein are utilized in step 1528.

Mask data preparation (step 1530): This step provides the "tape-out" data for production of masks for lithographic use to produce finished chips. Exemplary EDA software products from Synopsys, Inc. that can be used at this step include the CATS® family of products.

As indicated above, physical verification step 1526 and resolution enhancement step 1528 can benefit from the DRC processing tool and method of the present invention. Currently, most DRC processing of early-stage (dirty) IC designs involves significant amounts of unnecessary DRC processing time and associated error data, much of which being unusable, thereby generated unnecessary delays in bringing an IC device to market. Advantageously, by using the above-described dirty DRC processing technique, the identification of layout errors in dirty IC designs is automated in a manner that significantly reduces the time between product idea 1500 to tape-out 1540.

Figure 12:
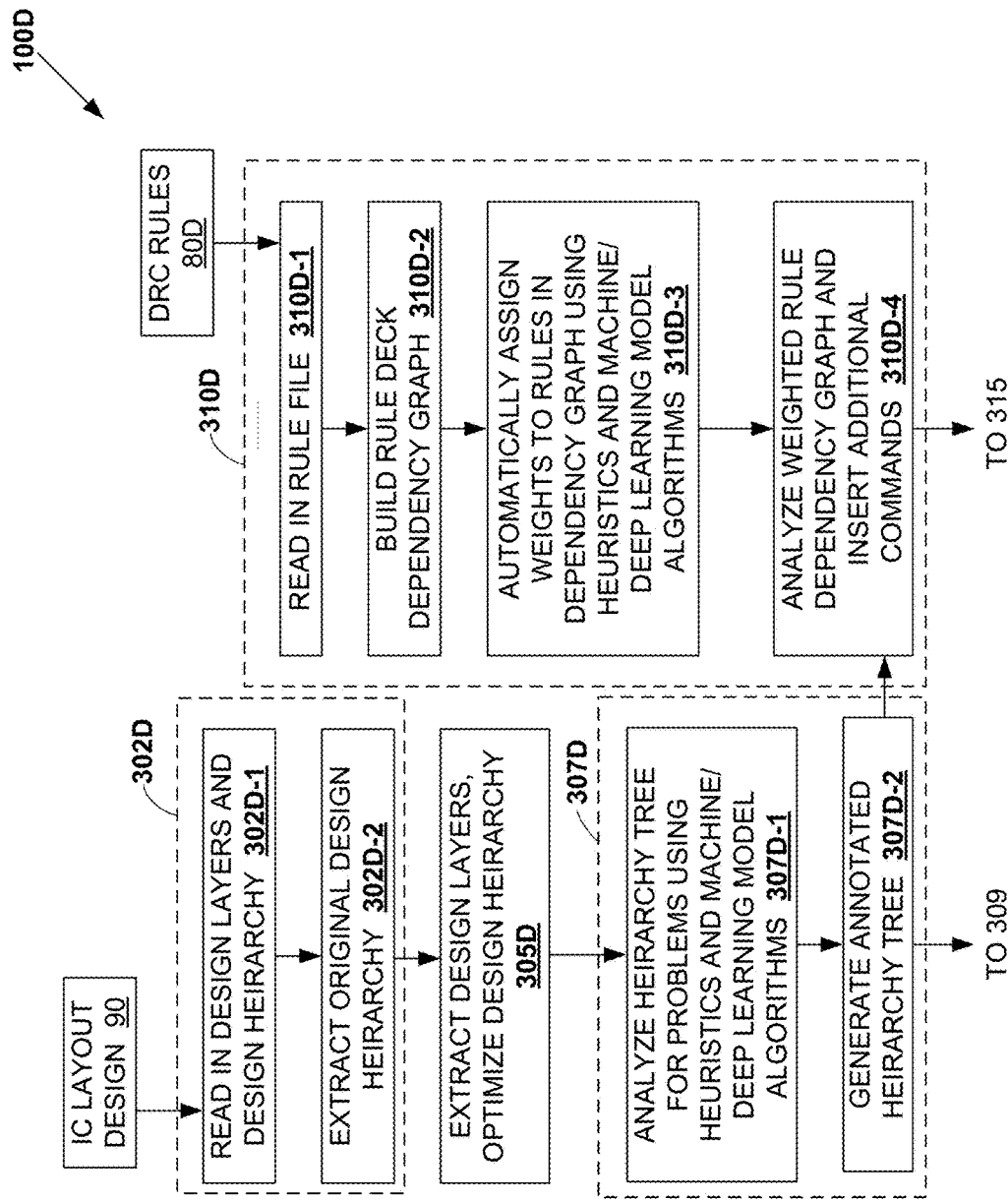
FIG. 12 is a flow diagram illustrating a partial DRC tool/method/system according to an alternative exemplary embodiment of the present invention.

Although the present invention has been described with respect to certain specific embodiments and greatly simplified examples, it will be clear to those skilled in the art that the inventive features of the present invention are applicable to other embodiments as well, all of which are intended to fall within the scope of the present invention. For example, FIG. 12 shows a partial DRC tool 100D including additional features related to practical applications involving IC layout design 90, where functional portions of DRC tool 100D that are generally related to those mentioned above with reference to FIG. 3 are identified using similar reference numbers. Specifically, functional unit 302D corresponds to block 302 of FIG. 3, and includes reading in the design layers and design hierarchy of IC layout design 90 (block 302D-1) and extracting the original design hierarchy (block 302D-2). Functional unit 305D corresponds to block 305 of FIG. 3, and includes the additional step of extracting design layers and optimizing the design hierarchy. Functional unit 307D corresponds to block 307 of FIG. 3, and includes analyzing the hierarchy tree generated in block 305D for problematic cells using heuristics and machine/deep learning model algorithms (block 307D-1), and generating an annotated hierarchy tree (block 307D-2). Functional unit 310D corresponds to block 310 of FIG. 3, and includes reading in a rule file 80D (block 310D-1), building a rule deck dependency graph (block 310D-2), automatically assigning weights to rules in dependency graph using heuristics and machine/deep learning model algorithms (block 310D-3), and analyzing the weighted rule dependency graph and inserting additional commands (block 310D-4). In one embodiment, analysis of the weighted rule dependency graph (block 310D-4) utilizes the annotated hierarchy tree data generated by functional unit 307D-2, as indicated by the horizontal arrow extending between these two blocks.

The invention claimed is:

1. A design rule checking (DRC) tool comprising:

means for generating a design layout workspace including a plurality of designated cells that collectively define an early-stage integrated circuit (IC) layout design; and means for performing a plurality of rule check processes, each rule check process including analyzing a selected current cell of said plurality of designated cells in said design layout workspace using a sequentially selected current rule of a plurality of rules, and recording an associated rule violation when said selected current cell violates said selected current rule, wherein performing said plurality of rule check processes includes sequentially selecting said current rule from said plurality of rules such that a first said rule check process is performed using a first rule of said plurality of rules as a selected first said current rule on at least some of the cells in said design layout workspace, and then a second rule check process is performed using a second rule of said plurality of rules as a selected second said current rule, wherein said means for performing a plurality of rule check processes includes means for terminating said first rule check process when a first rate of rule violations of said selected first current rule exceeds a predetermined maximum error rate value, and for initiating said second rule check process using said selected second current rule before at least some of said cells in said design layout workspace have been checked using said selected first current rule, wherein said DRC tool further comprising means for generating error information upon termination of said plurality of rule check processes such that said error information includes data identifying said terminated first rule check process, wherein each cell of said associated plurality of cells is characterized by associated location data identifying a relative X-Y location of said each cell of said plurality of cells, and wherein said means for generating said error information further includes means for generating graphic error data depicting each designated cell having at least one said rule violation by a corresponding dot, each said corresponding dot being relatively positioned at an X-Y location corresponding to the relative X-Y location of said corresponding designated cell.

2. The design rule checking tool of claim 1, further comprising means for identifying a problematic layout region when a second rate of rule violations generated during said second rule check process exceeds said predetermined maximum error rate value, and for suspending a group of cells of said plurality of cells that are associated with said problematic layout region from subsequent rule check processing.

3. The design rule checking tool of claim 1, further comprising means for generating a rule check runset order by automatically assigning a rank value to each rule of said plurality of rules, wherein said means for performing a plurality of rule check processes further comprises means for sequentially selecting said first current rule and said second current rule based on said rule runset order.

4. The DRC tool of claim 3, wherein said means for generating a rule check runset order includes means for anticipating an associated anticipated rule execution time duration for each rule of said plurality of rules, and for establishing said rule check runset order based on said anticipated rule execution time duration such that a first said rule having a relatively short anticipated rule execution time duration is assigned a high rank value, and a second rule having a relatively long anticipated rule execution time duration is assigned a low rank value, whereby said first rule is arranged ahead of said second rule in said rule check runset order.

5. The DRC tool of claim 3, wherein said means for generating a rule check runset order includes means for identifying the presence of one or more time-consuming operations in at least some of said plurality of rules, and for establishing said rule check runset order such that a first said rule that omits said one or more time-consuming operations is assigned a high rank value, and a second rule including said one or more time-consuming operations is assigned a low rank value, whereby said first rule is arranged ahead of said second rule in said rule check runset order.

6. The design rule checking tool of claim 3, further comprising means for terminating said plurality of rule check processing when one of (a) a total DRC processing time exceeds a predetermined maximum processing time period, and (b) a total number of said rule violations exceeds a predetermined maximum error limit value.

7. The DRC tool of claim 1, wherein said means for generating said design layout workspace comprises:
 means for transferring a first plurality of cells into said design layout workspace at a first time, said first plurality of cells collectively defining at least a portion of said IC layout design at said first time;
 means for identifying and deleting from said design layout workspace one or more pre-designated cells of the first plurality of cells at a second time, whereby said design layout workspace at said second time includes a second plurality of cells comprising a subset of said first plurality of cells; and
 means for identifying one or more problematic cells in said remaining plurality of cells, each problematic cell of said one or more problematic cells being characterized by having associated size and location data that violates one or more cell placement rules, and for conditionally removing said one or more problematic cells from said design layout workspace at a third time, whereby said design layout workspace at said third time includes said plurality of designated cells.

8. The DRC tool of claim 7, wherein said means for identifying and deleting from said design layout workspace one or more pre-designated cells comprises means for deleting a known-good cell or a dummy cell.

9. A design rule checking (DRC) method comprising:
 generating a design layout workspace including a plurality of designated cells that collectively define an early-stage integrated circuit (IC); and
 performing a plurality of rule check processes, each rule check process including analyzing a selected current cell of said plurality of designated cells in said design layout workspace using a sequentially selected current rule of said plurality of rules, and recording an associated rule violation when said selected current cell violates said selected current rule, wherein performing said plurality of rule check processes includes sequentially selecting said current rule from a plurality of rules such that a first said rule check process is performed using a first rule of said plurality of rules as a selected first said current rule on at least some of the cells in said design layout workspace, and then a second rule check process is performed using a second rule of said plurality of rules as a selected second said current rule,
 wherein performing said plurality of rule check processes includes terminating said first rule check process when a first rate of rule violations of said selected first current rule exceeds a predetermined maximum error rate value, and initiating said second rule check process using said selected second current rule before at least some of said cells in said design layout workspace have been checked using said selected first current rule,
 wherein said DRC method further comprises generating error information upon termination of said plurality of rule check processes such that said error information includes data identifying said terminated first rule check process,
 wherein each cell of said associated plurality of cells is characterized by associated location data identifying a relative X-Y location of said each cell of said plurality of cells, and
 wherein generating said error information further includes generating graphic error data depicting each designated cell having at least one said rule violation by a corresponding dot, each said corresponding dot being relatively positioned at an X-Y location corresponding to the relative X-Y location of said corresponding designated cell.

10. The design rule checking method of claim 9, further comprising identifying a problematic layout region when a second rate of rule violations generated during said second rule check process exceeds said predetermined maximum error rate value, and suspending a group of cells of said plurality of cells that are associated with said problematic layout region from subsequent rule check processing.

11. The design rule checking method of claim 9, further comprising generating a rule check runset order by automatically assigning a rank value to each rule of said plurality of rules,
 wherein performing said plurality of rule check processes further comprises sequentially selecting said first current rule and said second current rule based on said rule runset order.

12. The DRC method of claim 11, wherein generating said rule check runset order includes means for anticipating an associated anticipated rule execution time duration for each rule of said plurality of rules, and for establishing said rule check runset order based on said anticipated rule execution time duration such that a first said rule having a relatively short anticipated rule execution time duration is assigned a high rank value, and a second rule having a relatively long anticipated rule execution time duration is assigned a low rank value, whereby said first rule is arranged ahead of said second rule in said rule check runset order.

13. The DRC method of claim 11, wherein generating said rule check runset order includes identifying the presence of one or more time-consuming operations in at least some of said plurality of rules, and establishing said rule check runset order such that a first said rule that omits said one or more time-consuming operations is assigned a high rank value, and a second rule including said one or more time-consuming operations is assigned a low rank value, whereby said first rule is arranged ahead of said second rule in said rule check runset order.

14. The design rule checking method of claim 11, further comprising terminating said plurality of rule check processing when (a) a total DRC processing time exceeds a predetermined maximum processing time period, or (b) a total number of said rule violations exceeds a predetermined maximum error limit value.

15. The DRC method of claim 9, wherein generating said design layout workspace comprises:
transferring a first plurality of cells into said design layout workspace at a first time, said first plurality of cells collectively defining at least a portion of said IC layout design at said first time;
identifying and deleting from said design layout workspace one or more pre-designated cells of the first plurality of cells at a second time, whereby said design layout workspace at said second time includes a second plurality of cells comprising a subset of said first plurality of cells; and
identifying one or more problematic cells in said remaining plurality of cells, each problematic cell of said one or more problematic cells being characterized by having associated size and location data that violates one or more cell placement rules, and conditionally removing said one or more problematic cells from said design layout workspace at a third time, whereby said design layout workspace at said third time includes said plurality of designated cells.

16. The DRC method of claim 15, wherein identifying and deleting from said design layout workspace one or more pre-designated cells comprises identifying and deleting a known-good cell or a dummy cell.

17. A system comprising:
a memory storing instructions; and
a processor, coupled with the memory and to execute the instructions, the instructions when executed cause the processor to execute operations including:
generate a design layout workspace including a plurality of designated cells that collectively define said early-stage IC layout design; and
perform a plurality of rule check processes, each rule check process including analyzing a selected current cell of said plurality of designated cells in said design layout workspace using a sequentially selected current rule of said plurality of rules, and recording an associated rule violation when said selected current cell violates said selected current rule, wherein said perform operation includes sequentially selecting said current rule from said plurality of rules such that a first said rule check process is performed using a first rule of said plurality of rules as a selected first said current rule on at least some of the cells in said design layout workspace, and then a second rule check process is performed using a second rule of said plurality of rules as a selected second said current rule,
wherein said perform operation further includes terminating said first rule check process when a first rate of rule violations of said selected first current rule exceeds a predetermined maximum error rate value, and initiating said second rule check process using said selected second current rule before at least some of said cells in said design layout workspace have been checked using said selected first current rule,
generate error information upon termination of said plurality of rule check processes such that said error information includes data identifying said terminated first rule check process,
wherein each cell of said associated plurality of cells is characterized by associated location data identifying a relative X-Y location of said each cell of said plurality of cells, and
wherein said generate error information operation further includes generating graphic error data depicting each designated cell having at least one said rule violation by a corresponding dot, each said corresponding dot being relatively positioned at an X-Y location corresponding to the relative X-Y location of said corresponding designated cell.

18. The system of claim 17, wherein the instructions cause the processor to execute further operations including identify a problematic layout region when a second rate of rule violations generated during said second rule check process exceeds said predetermined maximum error rate value, and suspend a group of cells of said plurality of cells that are associated with said problematic layout region from subsequent rule check processing.

19. The system of claim 17,
wherein the instructions cause the processor to execute further operations including generate a rule check runset order by automatically assigning a rank value to each rule of said plurality of rules, and
wherein the perform operation further includes sequentially selecting said first current rule and said second current rule based on said rule runset order.

20. The system of claim 19, wherein the generate operation includes anticipating an associated anticipated rule execution time duration for each rule of said plurality of rules, and establishing said rule check runset order based on said anticipated rule execution time duration such that a first said rule having a relatively short anticipated rule execution time duration is assigned a high rank value, and a second rule having a relatively long anticipated rule execution time duration is assigned a low rank value, whereby said first rule is arranged ahead of said second rule in said rule check runset order.

* * * * *